United States Patent
Sumitani

(10) Patent No.: US 7,586,128 B2
(45) Date of Patent: Sep. 8, 2009

(54) LIGHT-EMITTING APPARATUS

(75) Inventor: Naofumi Sumitani, Anan (JP)

(73) Assignee: Nichia Corporation, Tokushima (JP)

( * ) Notice: Subject to any disclaimer, the term of this patent is extended or adjusted under 35 U.S.C. 154(b) by 9 days.

(21) Appl. No.: 11/302,360

(22) Filed: Dec. 14, 2005

(65) Prior Publication Data

US 2006/0131591 A1 Jun. 22, 2006

(30) Foreign Application Priority Data

Dec. 16, 2004 (JP) ............................. 2004-363808

(51) Int. Cl.
*H01L 33/00* (2006.01)
(52) U.S. Cl. .................. 257/98; 257/79; 257/E25.028
(58) Field of Classification Search ................... 345/44, 345/46; 257/29–203
See application file for complete search history.

(56) References Cited

U.S. PATENT DOCUMENTS

2003/0006430 A1* 1/2003 Shibata et al. .............. 257/200
2003/0042844 A1* 3/2003 Matsumura et al. ......... 313/498
2004/0159850 A1* 8/2004 Takenaka ..................... 257/98

FOREIGN PATENT DOCUMENTS

JP 11-330557 11/1999

* cited by examiner

*Primary Examiner*—Brook Kebede
*Assistant Examiner*—Tony Tran
(74) *Attorney, Agent, or Firm*—Wenderoth, Lind & Ponack, L.L.P.

(57) ABSTRACT

A first GaN group light emitting element that emits blue light, a second GaN group light emitting element that emits green light, and a third light emitting element that emits red light are provided on a first lead terminal, a second lead terminal, and a third lead terminal, respectively. These lead terminals are secured by a securing member. A second portion in the first lead terminal and a second portion in the second lead terminal are wider than a second portion in the third lead electrode. The second portion of the third lead terminal is wider than parts corresponding to second portions of the fourth lead terminal to the sixth lead terminal.

11 Claims, 15 Drawing Sheets

(A)

(B)

(C)

(D)

(E)

PRIOR ART

LIGHT-EMITTING APPARATUS

BACKGROUND OF THE INVENTION

1. Field of the Invention

The present invention relates to a light emitting apparatus used in an image reader, backlight for liquid crystal, and so on. More particularly, the present invention relates to a light emitting apparatus used in a facsimile, a copier, a scanner, and so on.

2. Description of the Related Art

A light source apparatus for a conventional scanner, and so on, shown in FIG. 15 is known (for example, see Japanese Laid-Open Publication Kokai No. HEI 11-330557 (FIG. 3)). This light emitting apparatus includes a first lead frame 3210, a second lead frame 3220, a third lead frame 3230, a fourth lead frame 3240, and a resin member 4300 that secures these lead frames. The first lead frame 3210 includes a first portion 3211 that is electrically connected to an external terminal, a second portion 3212 that is exposed from the resin member 4300, and a third portion 3213 that is provided with a first light emitting element 3110, a second light emitting element 3120, and a third light emitting element 3130 (hereinafter referred to as "a first light emitting element group 3110, 3120 and 3130") mounted thereon.

These portions are integrally formed. The first light emitting element group 3110, 3120 and 3130 are mounted on the third portion 3213 of the first lead frame 3210. Respective electrodes on one side of the first, second and third light emitting elements 3110, 3120 and 3130 is connected to each of the second, third and fourth lead frames 3220, 3230 and 3240 by wires, respectively. As long as shown in the figure, it seems that the surface areas of the second portion 3212 of the first lead frame 3210, the second portion 3222 of the second lead frame 3220, the second portion 3232 of the third lead frame 3230, and the second portion 3242 of the fourth lead frame 3240 are equal.

SUMMARY OF THE INVENTION

In the conventional light emitting apparatus, since the three light emitting elements 3110, 3120 and 3130 are mounted on the one lead frame 3210, any of the light emitting elements may be damaged due to heat. For example, in the case where the RGB light emitting apparatus is produced by employing a GaN group semiconductor element as the first light emitting element 3110 that emits blue light, a GaN group semiconductor element as the second light emitting element 3120 that emits green light, and a semiconductor element as the third light emitting element 3130 that emits red light, when electric power is supplied through the first lead frame 3210, the first light emitting element 3110 and the first second light emitting element 3120 generate heat. A high heat conductive metal member is normally used as the first lead frame 3210. Accordingly, the heat generated in the first and second light emitting elements 3110 and 3120 is conducted to the third light emitting element 3130. There is a problem that this heat may damage the third light emitting element 3130. Particularly, in consideration of power improvement of light emitting elements in the future, the heat generated from the light emitting element is not ignorable.

Therefore, the present invention is aimed at providing a light emitting apparatus capable of suppressing damage to a light emitting element due to heat.

The inventor of the present invention has diligently studied to solve the above problem, and as a result developed the present invention.

A light emitting apparatus according to the present invention comprises a first GaN group light emitting element having a first light emission peak wavelength; a second GaN group light emitting element having a second light emission peak wavelength longer than the first light emission peak wavelength; a third light emitting element having a third light emission peak wavelength longer than the second light emission peak wavelength; a first lead terminal with the first light emitting element mounted thereon; a second lead terminal with the second light emitting element mounted thereon; a third lead terminal with the third light emitting element mounted thereon; a fourth lead terminal electrically connected to the first light emitting element; a fifth lead terminal electrically connected to the second light emitting element; a sixth lead terminal electrically connected to the third light emitting element; and a securing member that secures the first to sixth lead terminals. The first lead terminal is composed integrally of a first portion that is electrically connected to an external terminal, a second portion that is exposed from the securing member and a third portion that is provide with the first light emitting element mounted thereon. The second lead terminal is composed integrally of a first portion that is electrically connected to an external terminal, a second portion that is exposed from the securing member and a third portion that is provide with the second light emitting element mounted thereon. The third lead terminal is composed integrally of a first portion that is electrically connected to an external terminal, a second portion that is exposed from the securing member and a third portion that is provide with the third light emitting element mounted thereon. The surface area of the first and second portions in any of the first and second lead terminals is larger than the surface area of the first and second portions in the third lead terminal.

It is preferable that the first portions of the first, second and third lead terminals have substantially the same width, and the surface areas of the second portions of the first and second lead terminals are larger than the second portion of the third lead terminal.

It is preferable that the surface area of an exposed part of the third lead terminal is larger than an exposed part of the sixth lead terminal.

At least any two of the fourth to sixth lead terminals can be integrally formed.

It is preferable that the second and first portions of the first lead terminal extend from one surface of the securing member, and the fourth portion of the first lead terminal extends from other surface of the securing member, and the second and first portions of the second lead terminal extend from one surface of the securing member, and the fourth portion of the second lead terminal extends from other surface of the securing member, It is preferable that the second and first portions of the first lead terminal extend from one surface of the securing member, and the fourth portion of the first lead terminal extends from other surface of the securing member, and a cut-off is formed in a part of the securing member where the fourth portion of the first lead terminal extends, and the fourth portion of the first lead terminal is located inward of the periphery thereof, and the second and first portions of the second lead terminal extend from one surface of the securing member, and the fourth portion of the second lead terminal extends from other surface of the securing member, and a cut-off is formed in a part of the securing member where the fourth portion of the second lead terminal extends, and the fourth portion of the second lead terminal is located inward of the periphery thereof.

It is preferable that any of the third portions of the first, second and third lead terminals is formed so as to provide an anchor effect.

The light emitting apparatus can further comprise one or more lead terminals, in this case a light emitting element is mounted to any one of the one or more lead terminals.

A light emitting apparatus according to the present invention comprises a first GaN group light emitting element having a first light emission peak wavelength; a second light emitting element having a second light emission peak wavelength longer than the first light emission peak wavelength; a first lead terminal with the first light emitting element mounted thereon; a second lead terminal with the second light emitting element mounted thereon; a third lead terminal electrically connected to the first light emitting element; a fourth lead terminal electrically connected to the second light emitting element; and a securing member that secures the first to fourth lead terminals. The first lead terminal is composed integrally of a first portion that is electrically connected to an external terminal, a second portion that is exposed from the securing member and a third portion that is provide with the first light emitting element mounted thereon. The second lead terminal is composed integrally of a first portion that is electrically connected to an external terminal, a second portion that is exposed from the securing member and a third portion that is provide with the second light emitting element mounted thereon. The surface area of the first and second portions in the first lead terminal is larger than the surface area of the first and second portions in the second lead terminal.

It is preferable that the first portions of the first and second lead terminals have substantially the same width, and the surface area of the second portion of the first lead terminal is larger than the second portion of the second lead terminal.

It is preferable that the surface area of the first and second portions in the first lead terminal is larger than the surface area of the first and second portions in the third lead terminal.

It is preferable that the surface area of an exposed part of the second lead terminal is larger than an exposed part of the third lead terminal.

The third lead terminal and the fourth lead terminal can be integrally formed.

It is preferable that the second and first portions of the first lead terminal extend from one surface of the securing member, and the fourth portion of the first lead terminal extends from other surface of the securing member, and the second and first portions of the second lead terminal extend from one surface of the securing member, and the fourth portion of the second lead terminal extends from other surface of the securing member.

It is preferable that the second and first portions of the first lead terminal extend from one surface of the securing member, and the fourth portion of the first lead terminal extends from other surface of the securing member, and a cut-off is formed in a part of the securing member where the fourth portion of the first lead terminal extends, and the fourth portion of the first lead terminal is located inward of the periphery thereof, and the second and first portions of the second lead terminal extend from one surface of the securing member, and the fourth portion of the second lead terminal extends from other surface of the securing member, and a cut-off is formed in a part of the securing member where the fourth portion of the second lead terminal extends, and the fourth portion of the second lead terminal is located inward of the periphery thereof.

It is preferable that the third portions of the first and second lead terminals are formed so as to provide an anchor effect.

The securing member can include a window portion having bottom and side surfaces formed therein, and the bottom surface is provided with at least parts of the third portion of the first lead terminal that is provide with the first light emitting element mounted thereon and the third portion of the second lead terminal that is provide with the second light emitting element mounted thereon, in this case the window portion that is encompassed by the bottom and side surfaces is provided with a transparent resin.

The transparent resin can include a phosphor material.

A light emitting apparatus according to the present invention comprises a first GaN group light emitting element; a second GaN group light emitting element; a first lead terminal with the first light emitting element mounted thereon; a second lead terminal with the second light emitting element mounted thereon; a third lead terminal electrically connected to the first light emitting element; a fourth lead terminal electrically connected to the second light emitting element; and a securing member that secures the first to fourth lead terminals. The first lead terminal is composed integrally of a first portion that is electrically connected to an external terminal, a second portion that is exposed from the securing member and a third portion that is provide with the first light emitting element mounted thereon. The second lead terminal is composed integrally of a first portion that is electrically connected to an external terminal, a second portion that is exposed from the securing member and a third portion that is provide with the second light emitting element mounted thereon. The securing member includes a window portion having bottom and side surfaces formed therein, and the bottom surface is provided with at least the third portion of the first lead terminal that is provide with the first light emitting element mounted thereon and the third portion of the second lead terminal that is provide with the second light emitting element mounted thereon, wherein the window portion that is encompassed by the bottom and side surfaces is provided with a transparent resin. The surface area of the first and second portions in each of the first and second lead terminals is larger than the surface area of the first and second portions in the third lead terminal.

The transparent resin can include a phosphor material.

The transparent resin can protrude from the window portion.

It is preferable that the first portions of the first and second lead terminals have substantially the same width, and the surface area of the second portion of the first lead terminal is larger than the second portion of the second lead terminal.

The third lead terminal and the fourth lead terminal can be integrally formed.

It is preferable that the second and first portions of the first lead terminal extend from one surface of the securing member, and the fourth portion of the first lead terminal extends from other surface of the securing member. In addition, it is preferable that the second and first portions of the second lead terminal extend from one surface of the securing member, and the fourth portion of the second lead terminal extends from other surface of the securing member, It is preferable that the second and first portions of the first lead terminal extend from one surface of the securing member, and the fourth portion of the first lead terminal extends from other surface of the securing member, wherein a cut-off is formed in a part of the securing member where the fourth portion of the first lead terminal extends, and the fourth portion of the first lead terminal is located inward of the periphery thereof. It is preferable that the second and first portions of the second lead terminal extend from one surface of the securing member, and the fourth portion of the second lead terminal extends from other surface of the securing member, wherein a cut-off is formed in a part of the securing member where the fourth portion of the second lead terminal extends, and the fourth portion of the second lead terminal is located inward of the periphery thereof.

It is preferable that the third portions of the first and second lead terminals are formed so as to provide an anchor effect.

A light source according to the present invention comprises said light emitting apparatus and a light guiding member that guides light emitted from the light emitting apparatus.

The aforementioned construction of the present invention provides the effects as discussed below.

A light emitting apparatus according to the present invention comprises a first GaN group light emitting element having a first light emission peak wavelength; a second GaN group light emitting element having a second light emission peak wavelength longer than the first light emission peak wavelength; a third light emitting element having a third light emission peak wavelength longer than the second light emission peak wavelength; a first lead terminal with the first light emitting element mounted thereon; a second lead terminal with the second light emitting element mounted thereon; a third lead terminal with the third light emitting element mounted thereon; a fourth lead terminal electrically connected to the first light emitting element; a fifth lead terminal electrically connected to the second light emitting element; a sixth lead terminal electrically connected to the third light emitting element; and a securing member that secures the first to sixth lead terminals. The first lead terminal is composed integrally of a first portion that is electrically connected to an external terminal, a second portion that is exposed from the securing member and a third portion that is provide with the first light emitting element mounted thereon. The second lead terminal is composed integrally of a first portion that is electrically connected to an external terminal, a second portion that is exposed from the securing member and a third portion that is provide with the second light emitting element mounted thereon. The third lead terminal is composed integrally of a first portion that is electrically connected to an external terminal, a second portion that is exposed from the securing member and a third portion that is provide with the third light emitting element mounted thereon. The surface area of the first and second portions in any of the first and second lead terminals is larger than the surface area of the first and second portions in the third lead terminal. Since the lead terminals are separately provided to mount the first to third light emitting element, the heat from the first and second light emitting elements is not directly conducted to the third light emitting element. Accordingly, it is possible to prevent damage to the third light emitting element due to the heat. In addition, as for the first and second light emitting elements that generate a relatively large amount of heat, the surface areas of the second portions, and so on, of the first and second light emitting elements are increased to improve heat dissipation characteristics. Additionally, it is possible to efficiently and externally dissipate a larger amount of heat generated from the first or second light emitting element as compared with than the third light emitting element.

It is preferable that the first portions of the first and second lead terminals have substantially the same width, and the surface areas of the second portions of the first and second lead terminals are larger than the second portion of the third lead terminal. In this case, the light emitting apparatus according to the present invention can be electrically connected to a power supply that is conventionally used without changing its shape. Additionally, it is possible to efficiently and externally dissipate a larger amount of heat generated from the first and second light emitting elements as compared with than the third light emitting element. Since respective first portions have substantially the same width, the second portion wider than the first portion serves as a stopper.

It is preferable that the surface area of an exposed part of the third lead terminal is larger than an exposed part of the sixth lead terminal. Since the surface area of the third lead terminal that is provided with a light emitting element is larger than the sixth lead terminal that is not provided with a light emitting element mounted thereon, it is possible to further improve the heat dissipation characteristics. Accordingly, surface areas exposed from the securing member are increased in order of a group of the fourth, fifth and sixth lead terminals that are not provided with a light emitting element, a group of the third lead terminal, and a group of the first and second lead terminals, in order to improve the heat dissipation characteristics.

At least any two of the fourth to sixth lead terminals can be integrally formed. In this case, it is possible to reduce the number of the lead terminals, and thus to provide a simple circuit. For example, there is a specific case where the first to third lead terminals are serves as anode terminals, and the fourth to sixth lead terminals are serves as cathode electrodes. Even in the case of integration, the integrated terminal is referred to as any of the fourth to sixth lead terminals.

It is preferable that the second and first portions of the first lead terminal extend from one surface of the securing member, and the fourth portion of the first lead terminal extends from other surface of the securing member, and the second and first portions of the second lead terminal extend from one surface of the securing member, and the fourth portion of the second lead terminal extends from other surface of the securing member. In the case where a die cut lead frame with a prescribed shape is sandwiched between upper and lower molds and a prescribed resin is poured therein by a transfer molding method, the lead frame may wobble. Pressing the first and second portions of each lead terminal cannot sufficiently suppress the wobbling. However, a mold presses a part corresponding to the fourth portion, and thus can reduce the wobbling of lead frame. After molding of the securing member, this part corresponding to the fourth portion is cut, and remains so as to be exposed from the securing member.

It is preferable that the second and first portions of the first lead terminal extend from one surface of the securing member, and the fourth portion of the first lead terminal extends from other surface of the securing member, wherein a cut-off is formed in a part of the securing member where the fourth portion of the first lead terminal extends, and the fourth portion of the first lead terminal is located inward of the periphery thereof, and the second and first portions of the second lead terminal extend from one surface of the securing member, and the fourth portion of the second lead terminal extends from other surface of the securing member, wherein a cut-off is formed in a part of the securing member where the fourth portion of the second lead terminal extends, and the fourth portion of the second lead terminal is located inward of the periphery thereof. Accordingly, the fourth portion does not lie off the outer profile of the securing member, and thus does not interfere when a light emitting apparatus is mounted.

It is preferable that any of the third portions of the first, second and third lead terminals is formed so as to provide an anchor effect. This can prevent the lead terminal from dropping off. Particularly, each third portion of the first to third lead terminals is wide. Accordingly, they can be easily formed so as to provide an anchor effect. For example, in the case where asperities exist, or in the case where the securing member is provided in a hole formed in the third portion, an anchor effect is provided.

The light emitting apparatus further can comprise one or more lead terminals, wherein a light emitting element is mounted to any one of the one or more lead terminals. This can provide a light emitting apparatus with a desired color tone.

A light emitting apparatus according to the present invention comprises a first GaN group light emitting element having a first light emission peak wavelength; a second light emitting element having a second light emission peak wavelength longer than the first light emission peak wavelength; a first lead terminal with the first light emitting element mounted thereon; a second lead terminal with the second light emitting element mounted thereon; a third lead terminal electrically connected to the first light emitting element; a fourth lead terminal electrically connected to the second light emitting element; and a securing member that secures the first to fourth lead terminals. In the light emitting apparatus, the first lead terminal is composed integrally of a first portion that is electrically connected to an external terminal, a second portion that is exposed from the securing member and a third portion that is provide with the first light emitting element mounted thereon. In addition, the second lead terminal is composed integrally of a first portion that is electrically connected to an external terminal, a second portion that is exposed from the securing member and a third portion that is provide with the second light emitting element mounted thereon. Additionally, the surface area of the first and second portions in the first lead terminal is larger than the surface area of the first and second portions in the second lead terminal. This can prevent damage to the second light emitting element due to heat generation in operation of the first light emitting element. In addition, it is possible to improve the heat dissipation characteristics of the first light emitting element.

It is preferable that the first portions of the first and second lead terminals have substantially the same width, and the surface area of the second portion of the first lead terminal is larger than the second portion of the second lead terminal. In this case, the light emitting apparatus according to the present invention can be electrically connected to a power supply that is conventionally used without changing its shape. Additionally, it is possible to efficiently and externally dissipate a larger amount of heat generated from the first light emitting element as compared with than the second light emitting element. Since respective first portions have substantially the same width, the second portion wider than the first portion serves as a stopper.

It is preferable that the surface area of the first and second portions in the first lead terminal is larger than the surface area of the first and second portions in the third lead terminal. This can improve the heat dissipation characteristics. In addition, this can minimize a required part to be exposed from the securing member of the lead terminal. Therefore, it is possible to downsize a light emitting apparatus.

It is preferable that the surface area of an exposed part of the second lead terminal is larger than an exposed part of the third lead terminal. Accordingly, surface areas exposed from the securing member are increased in order of a group of the third and fourth lead terminals that are not provided with a light emitting element, a group of the second lead terminal, and a group of the first lead terminal, in order to improve the heat dissipation characteristics.

The third lead terminal and the fourth lead terminal can be integrally formed. In this case, it is possible to reduce the number of the lead terminals, and thus to provide a simple circuit. Even in the case of integration, the integrated terminal is referred to as any of the third or fourth lead terminal.

It is preferable that the second and first portions of the first lead terminal extend from one surface of the securing member, and the fourth portion of the first lead terminal extends from other surface of the securing member, and the second and first portions of the second lead terminal extend from one surface of the securing member, and the fourth portion of the second lead terminal extends from other surface of the securing member. Similarly to the case as mentioned above, a mold presses a part corresponding to the fourth portion, and thus can reduce the wobbling of lead frame. After molding of the securing member, this part corresponding to the fourth portion is cut, and remains so as to be exposed from the securing member.

It is preferable that the second and first portions of the first lead terminal extend from one surface of the securing member, and the fourth portion of the first lead terminal extends from other surface of the securing member, wherein a cut-off is formed in a part of the securing member where the fourth portion of the first lead terminal extends, and the fourth portion of the first lead terminal is located inward of the periphery thereof, and the second and first portions of the second lead terminal extend from one surface of the securing member, and the fourth portion of the second lead terminal extends from other surface of the securing member, wherein a cut-off is formed in a part of the securing member where the fourth portion of the second lead terminal extends, and the fourth portion of the second lead terminal is located inward of the periphery thereof. Accordingly, the fourth portion does not lie off the outer profile of the securing member, and thus does not interfere when a light emitting apparatus is mounted.

It is preferable that the third portions of the first and second lead terminals are formed so as to provide an anchor effect. This can prevent the lead terminal from dropping off. Particularly, each third portion of the first and second lead terminals is wide. Accordingly, they can be easily formed so as to provide an anchor effect.

The securing member can include a window portion having bottom and side surfaces formed therein, and the bottom surface is provided with at least parts of the third portion of the first lead terminal that is provide with the first light emitting element mounted thereon and the third portion of the second lead terminal that is provide with the second light emitting element mounted thereon, wherein the window portion that is encompassed by the bottom and side surfaces is provided with a transparent resin. The refractive index difference between a light emitting element and air is large. In the case where the transparent resin is provided, it is possible to improve the outgoing efficiency of light from the light emitting elements. In addition, it is possible to protect the light emitting elements.

The transparent resin can include a phosphor material. This can provide a light emitting apparatus with a desired color tone. For example, in the case where a GaN group light emitting element as the first light emitting element that emits blue light, a light emitting element as the second light emitting element that emits red light, and a phosphor material that emits green to yellow luminescent radiation (e.g., a YAG phosphor) are combined, a light emitting apparatus that emits white light can be provided. In this case, it is possible to provide a high-power light emitting apparatus. Moreover, it is possible to provide a light emitting apparatus with less color deviation.

A light emitting apparatus according to the present invention comprises a first GaN group light emitting element; a second GaN group light emitting element; a first lead terminal with the first light emitting element mounted thereon; a second lead terminal with the second light emitting element mounted thereon; a third lead terminal electrically connected to the first light emitting element; a fourth lead terminal electrically connected to the second light emitting element; and a securing member that secures the first to fourth lead terminals. In the light emitting apparatus, the first lead terminal is composed integrally of a first portion that is electrically connected to an external terminal, a second portion that is exposed from the securing member and a third portion that is provide with the first light emitting element mounted thereon. In addition, the second lead terminal is composed integrally of a first portion that is electrically connected to an external terminal, a second portion that is exposed from the securing member and a third portion that is provide with the second light emitting element mounted thereon. Additionally, the securing member includes a window portion having bottom and side surfaces formed therein, and the bottom surface is provided with at least the third portion of the first lead terminal that is provide with the first light emitting element mounted thereon and the third portion of the second lead terminal that is provide with the second light emitting element mounted thereon, wherein the window portion that is encompassed by the bottom and side surfaces is provided with a transparent resin. Moreover, the surface area of the first and second portions in each of the first and second lead terminals is larger than the surface area of the first and second portions in the third lead terminal. The first and second light emitting element can be the same or different. Heat generated from one light emitting element is not directly conducted to another light emitting element. Accordingly, it is possible to prevent damage to a light emitting element due to the heat. In addition, as for the first and second light emitting elements that generate a relatively large amount of heat, the surface areas of the second portions, and so on, of the first and second light emitting elements are increased to improve heat dissipation characteristics.

The transparent resin can include a phosphor material. This can provide a light emitting apparatus with a desired color tone. For example, in the case where a GaN group light emitting element as the first light emitting element that emits blue light, a light emitting element as the second GaN group light emitting element that emits green light, and a phosphor material that emits red luminescent radiation (e.g., a nitride group phosphor) are combined, a light emitting apparatus that emits white light can be provided. Moreover, it is possible to provide a high-power light emitting apparatus with excellent color rendering. Moreover, it is possible to provide a light emitting apparatus with less color deviation.

The transparent resin can protrude from the window portion. In the case where the transparent resin that includes a phosphor material is employed, the amount of the transparent resin that is suitably adjusted can provide a light emitting apparatus with a desired color tone. In addition, in the case where the transparent resin has a lens shape, it is possible to improve the light-collecting characteristics.

It is preferable that the first portions of the first and second lead terminals have substantially the same width, and the surface area of the second portion of the first lead terminal is larger than the second portion of the second lead terminal. In this case, the light emitting apparatus according to the present invention can be electrically connected to a power supply that is conventionally used without changing its shape. Additionally, it is possible to efficiently and externally dissipate a larger amount of heat generated from the first light emitting element as compared with than the second light emitting element. Since respective first portions have substantially the same width, the second portion wider than the first portion serves as a stopper.

The third lead terminal and the fourth lead terminal can be integrally formed. In this case, it is possible to reduce the number of the lead terminals, and thus to provide a simple circuit. Even in the case of integration, the integrated terminal is referred to as any of the third or fourth lead terminal.

It is preferable that the second and first portions of the first lead terminal extend from one surface of the securing member, and the fourth portion of the first lead terminal extends from other surface of the securing member. In addition, it is preferable that the second and first portions of the second lead terminal extend from one surface of the securing member, and the fourth portion of the second lead terminal extends from other surface of the securing member. Similarly to the case as mentioned above, a mold presses a part corresponding to the fourth portion, and thus can reduce the wobbling of lead frame. After molding of the securing member, this part corresponding to the fourth portion is cut, and remains so as to be exposed from the securing member.

It is preferable that the second and first portions of the first lead terminal extend from one surface of the securing member, and the fourth portion of the first lead terminal extends from other surface of the securing member, and a cut-off is formed in a part of the securing member where the fourth portion of the first lead terminal extends, and the fourth portion of the first lead terminal is located inward of the periphery thereof. It is preferable that the second and first portions of the second lead terminal extend from one surface of the securing member, and the fourth portion of the second lead terminal extends from other surface of the securing member, wherein a cut-off is formed in a part of the securing member where the fourth portion of the second lead terminal extends, and the fourth portion of the second lead terminal is located inward of the periphery thereof. Accordingly, the fourth portion does not lie off the outer profile of the securing member, and thus does not interfere when a light emitting apparatus is mounted.

It is preferable that the third portions of the first and second lead terminals are formed so as to provide an anchor effect. This can prevent the lead terminal from dropping off. Particularly, each third portion of the first and second lead terminals is wide. Accordingly, they can be easily formed so as to provide an anchor effect.

A light source according to the present invention comprises said light emitting apparatus and a light guiding member that guides light emitted from the light emitting apparatus. It is preferable that the light guiding member has a shape that receives the light emitting apparatus fitted therein. In this case, light can be uniformly radiated from the light guiding member. Alternatively, light can be radiated only toward a prescribed direction.

The above and further objects and features of the invention will more fully be apparent from the following detailed description with accompanying drawings.

DETAILED DESCRIPTION OF THE PREFERRED EMBODIMENTS

First Embodiment (Light Emitting Apparatus)

Figure 1:
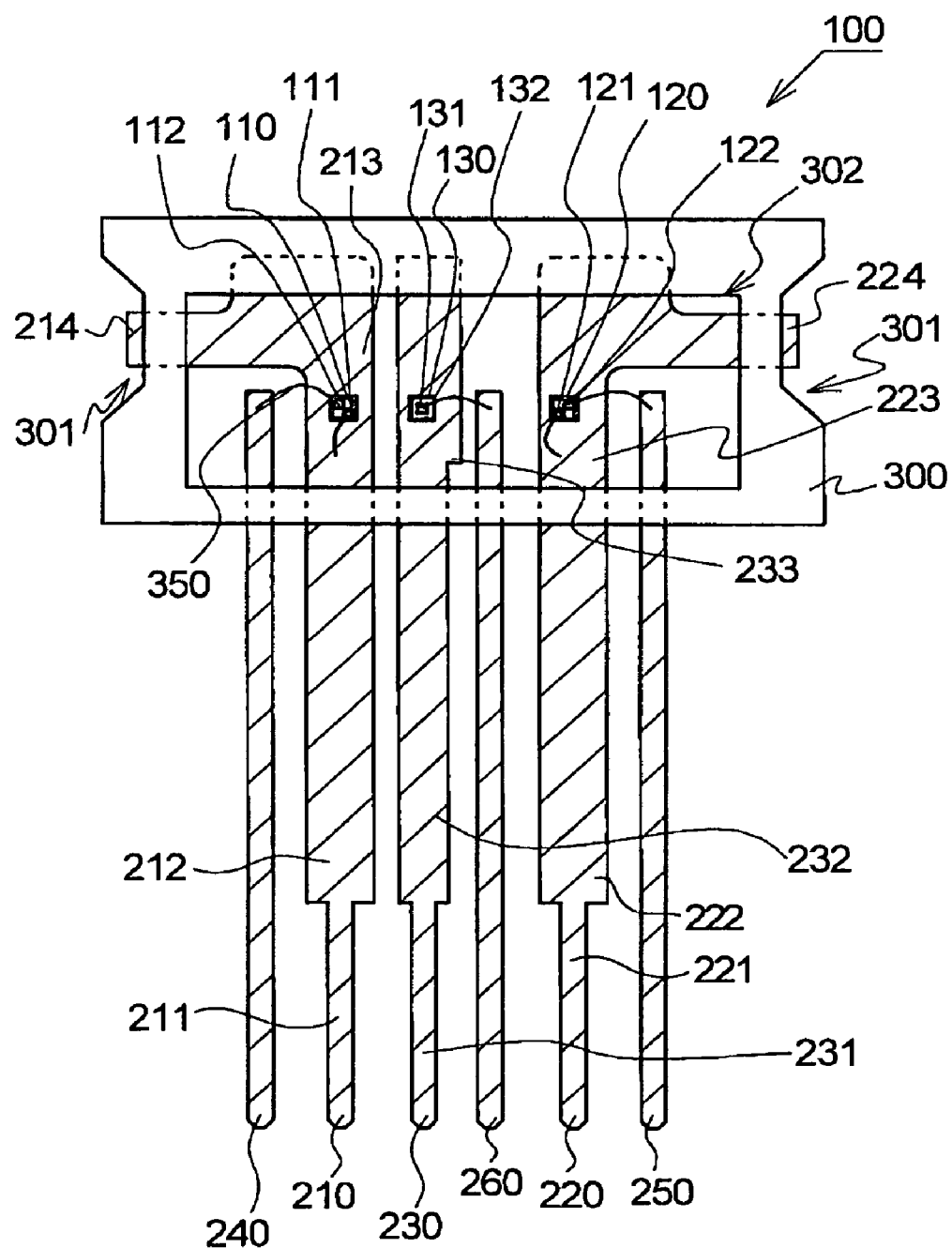
FIG. 1 is a schematic front view showing a light emitting apparatus according to a first embodiment.
Figure 2:
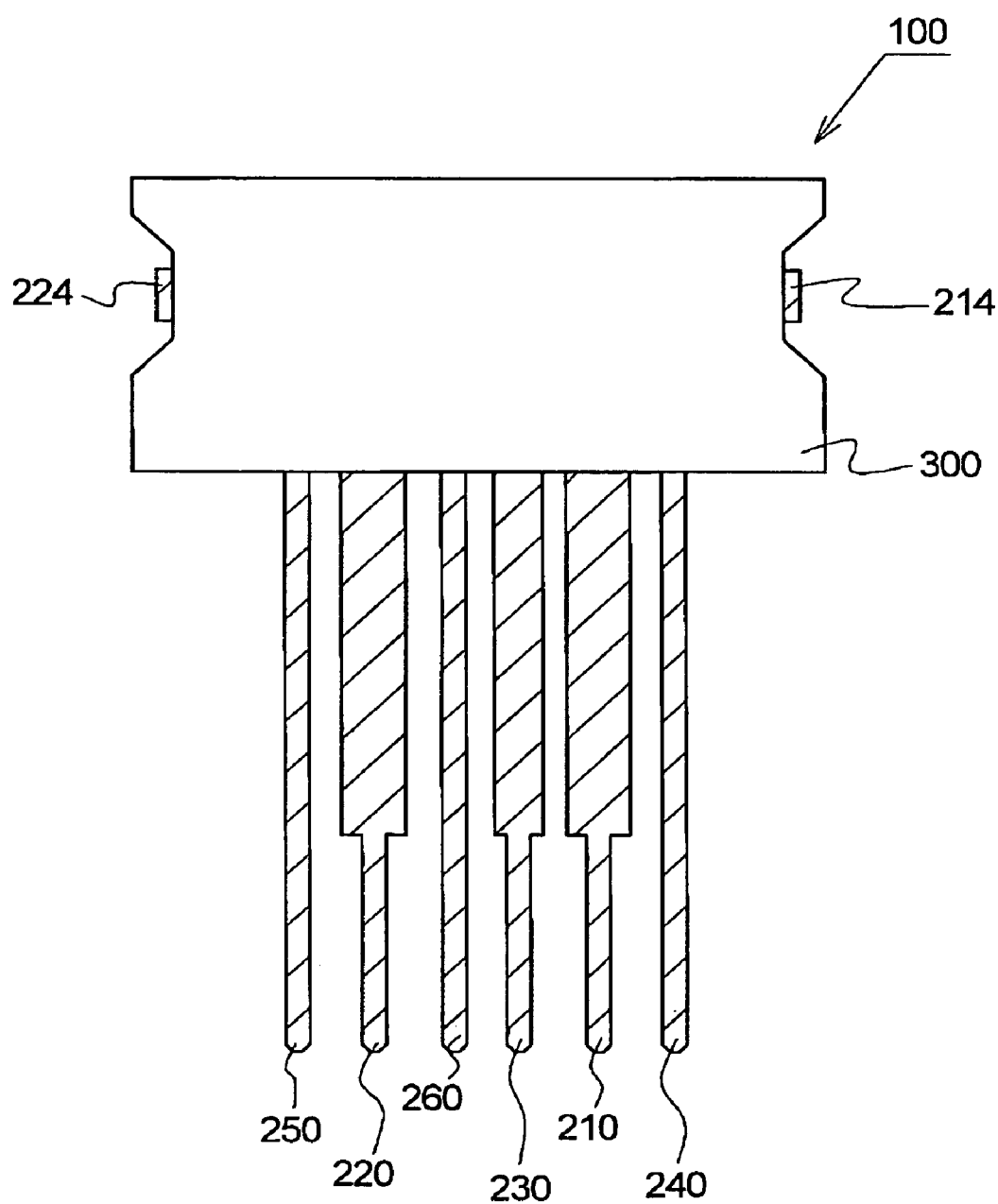
FIG. 2 is a schematic back view showing the light emitting apparatus according to the first embodiment.
Figure 3:
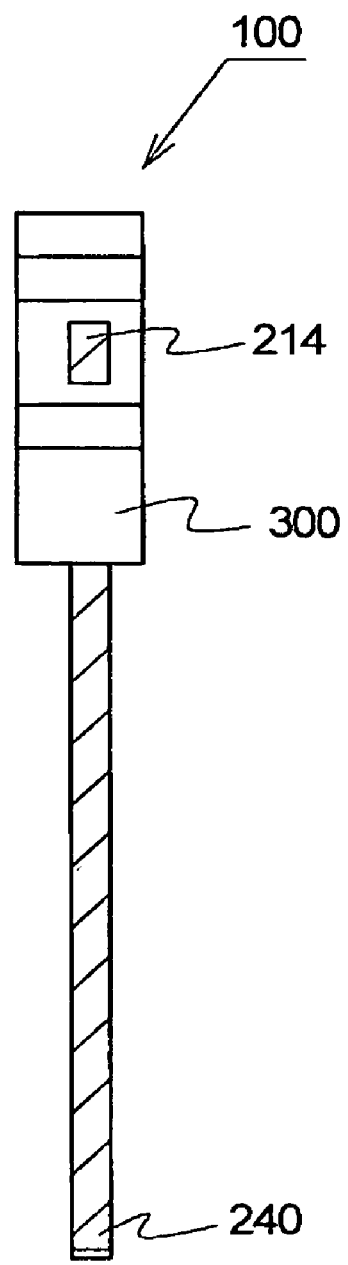
FIG. 3 is a schematic left side view showing the light emitting apparatus according to the first embodiment.
Figure 4:
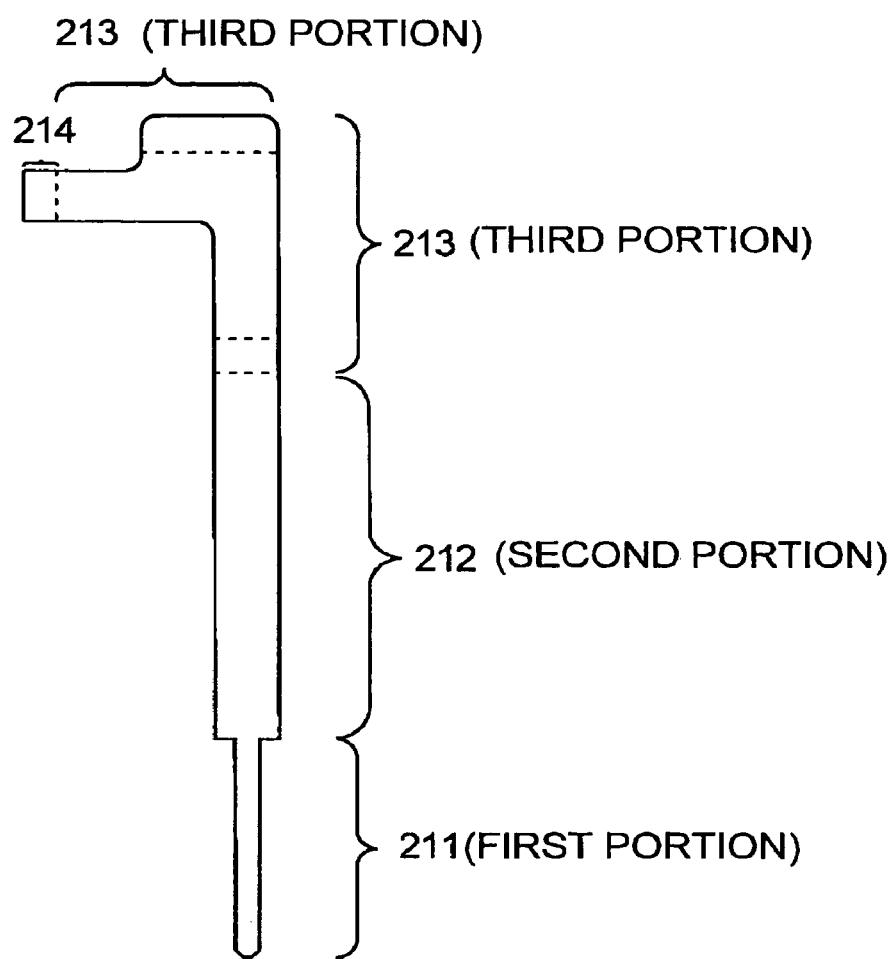
FIG. 4 is a schematic view showing a first lead terminal according to the first embodiment.
Figure 5:
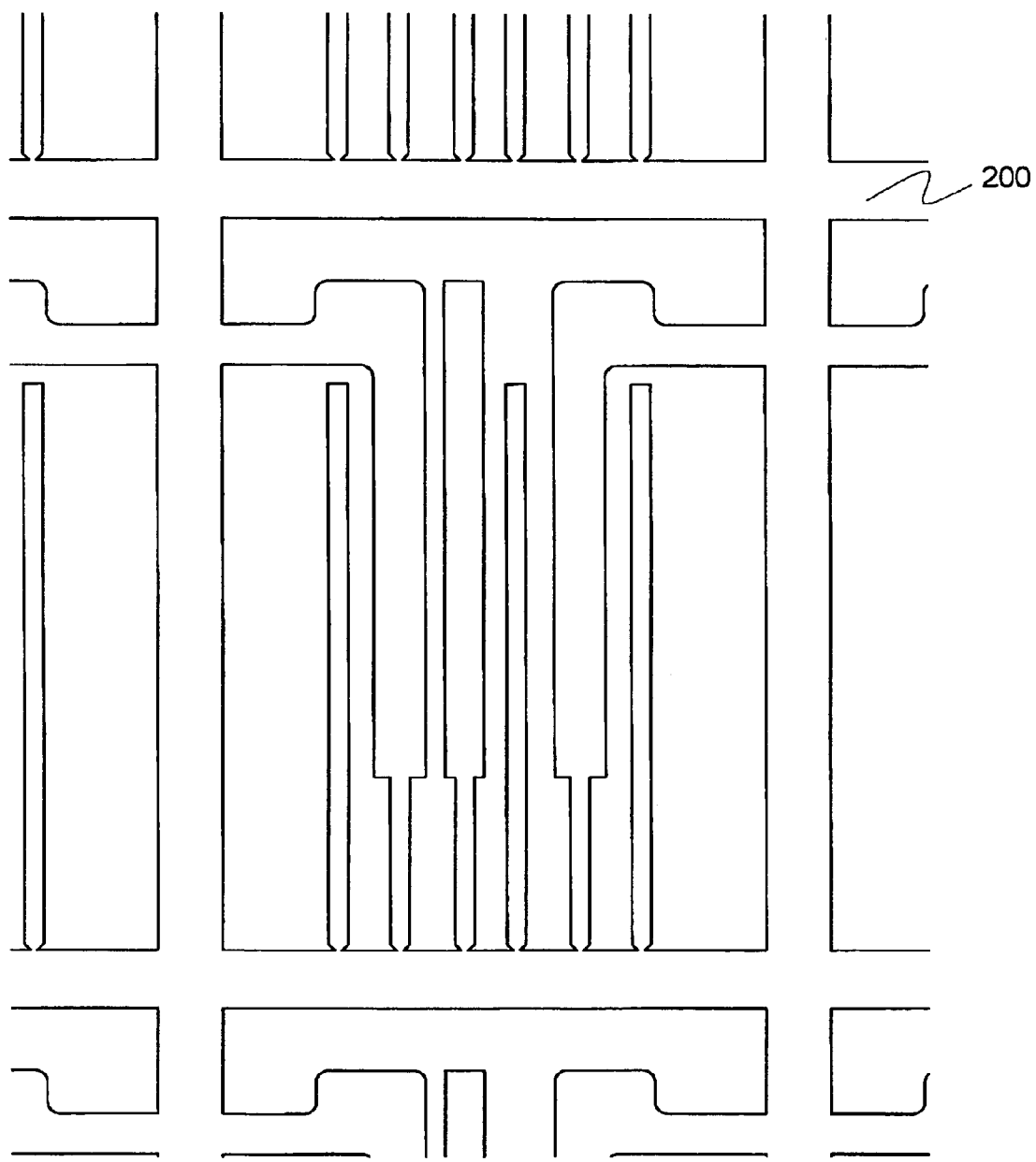
FIG. 5 is a schematic view showing a lead frame according to the first embodiment.

A light emitting apparatus according to a first embodiment is described with reference to the drawings. FIG. 1 is a schematic front view showing the light emitting apparatus according to the first embodiment. FIG. 2 is a schematic back view showing the light emitting apparatus according to the first embodiment. FIG. 3 is a schematic left side view showing the light emitting apparatus according to the first embodiment. FIG. 4 is a schematic view showing a first lead terminal according to the first embodiment. FIG. 5 is a schematic view showing a lead frame according to the first embodiment.

A light emitting apparatus 100 according to the first embodiment comprises a first GaN group light emitting element 110 having a first light emission peak wavelength; a second GaN group light emitting element 120 having a second light emission peak wavelength longer than the first light emission peak wavelength; a third light emitting element 130 having a third light emission peak wavelength longer than the second light emission peak wavelength; a first lead terminal 210 that is provided with the first light emitting element 110 mounted thereon; a second lead terminal 220 that is provided with the second light emitting element 120 mounted thereon; a third lead terminal 230 that is provided with the third light emitting element 130 mounted thereon; a fourth lead terminal 240 that is electrically connected to the first light emitting element 110; a fifth lead terminal 250 that is electrically connected to the second light emitting element 120; a sixth lead terminal 260 that is electrically connected to the third light emitting element 130; and a securing member 300 that secures the first lead terminal 210 to the sixth lead terminal 260.

The first lead terminal 210 is composed integrally of a first portion 211 that is electrically connected to an external terminal, a second portion 212 that is exposed from the securing member 300 and a third portion 213 that is provided with the first light emitting element 110 mounted thereon. The first portion 211, the second portion 212 and the third portion 213 do not always have clear boundaries. In this specification, a boundary that lies between parts with different widths divides the first portion 211 and the second portion. The first portion is located in the end side. A boundary between a part that is exposed from the light emitting apparatus 100 and a part that is not exposed divides the second portion 212 and the third portion 213. The part that is exposed from the light emitting apparatus 100 serves as the second portion 212. Although a part that can be provided with the first light emitting element 110 mounted thereon corresponds to a part of the third portion 213, a part that is located inside the light emitting apparatus 100 is referred to as the third portion 213 for ease of explanation. As for a later-described fourth portion 214, a boundary between a part that is exposed from the light emitting apparatus 100 and a part that is not exposed divides the third portion 213 and the fourth portion 214. The part that is exposed from the light emitting apparatus 100 serves as the fourth portion 214. Similarly, the second lead terminal 220 is composed integrally of a first portion 221 that is electrically connected to an external terminal, a second portion 222 that is exposed from the securing member 300 and a third portion 223 that is provided with the second light emitting element 120 mounted thereon. In addition, the third lead terminal 230 is composed integrally of a first portion 231 that is electrically connected to an external terminal, a second portion 232 that is exposed from the securing member 300 and a third portion 233 that is provided with the third light emitting element 130 mounted thereon.

The first light emitting element 110 is adhered to the third portion 213 of the first lead terminal 210 by a die-bonding member. The first light emitting element 110 includes a positive/negative pair of first and second electrodes 111 and 112 on the same surface side. The first and second electrodes 111 and 112 are electrically connected to the first and fourth lead terminals 210 and 240 by wires 350, respectively. Similarly, the second light emitting element 120 is adhered to the third portion 223 of the second lead terminal 220 by the die-bonding member. The second light emitting element 120 includes a positive/negative pair of first and second electrodes 121 and 122 on the same surface side. The first and second electrodes 121 and 122 are electrically connected to the second and fifth lead terminals 220 and 250 by wires 350, respectively. The third light emitting element 130 is adhered to the third portion 233 of the third lead terminal 230 by the die-bonding member. The third light emitting element 130 includes a first electrode 131 on the back surface side and a second electrode 132 on the upper surface side. The first electrode 111 is electrically connected to the third lead terminal 230 by means of a conductive die-bonding member. The second electrode 132 is electrically connected to the sixth lead terminal 260 by the wire 350.

The surface area of the first and second portions 211 and 212 in the first lead terminal 210, and the surface area of the first and second portions 221 and 222 in the second lead terminal 220 are larger than the surface area of the first and second portions 231 and 232 in the third lead terminal 230. The larger surface area increases the contact area in contact with the outside. Accordingly, it is possible to improve the heat dissipation characteristics. Particularly, parts corresponding to the first portions of the first portion 211 of the first lead terminal 210 and the first portion 221 of the second lead terminal 220, the first portion 231 of the third lead terminal 230, a first portion 241 of the fourth lead terminal 240, a first portion 251 of a fifth lead terminal 250, and a first portion 261 of the sixth lead terminal 260 have substantially the same width. The second portion 212 in the first lead terminal 210 and the second portion 222 in the second lead terminal 220 are substantially equal, and have surface areas larger than the second portion 232 in the third lead electrode 230. In addition, the second portion 232 of the third lead terminal 230 has a surface area larger than parts corresponding to second portions of the fourth lead terminal 240, the fifth lead terminal 250 and the sixth lead terminal 260. The reason is to ensure the heat dissipation characteristics. Although the third light emitting element 130 generates a less amount of heat as compared with the first light emitting element 110, it generates a certain amount of heat. It is preferable that the first portions of the first to sixth lead terminals 210 to 260 are equally spaced away from each other. The reason is that they can be inserted into a power supply that is conventionally used without changing its shape.

As viewed from the front side of the light emitting apparatus 100, the second portion 212 and the first portion 211 of the first lead terminal 210 extend from the bottom surface of the securing member 300, and the fourth portion 214 of the first lead terminal 210 extends from the left side surface of the securing member 300. In addition, the second portion 222 and the first portion 221 of the second lead terminal 220 extend from the bottom surface of the securing member 300, and the fourth portion 224 of the second lead terminal 220 extends from the right side surface of the securing member 300. The fourth portions 214 and 224 are parts that remain on the light emitting apparatus 100 side when the light emitting apparatus 100 is cut out from a lead frame 200 after the securing member 300 is molded. A cut-off portion 301 is formed in a part of the securing member 300 where the fourth portion 214 of the first lead terminal 210 extends, and the fourth portion 214 of the first lead terminal 210 is located inward of the periphery thereof. Another cut-off portion 301 is formed in a part of the securing member 300 where the fourth portion 224 of the second lead terminal 220 extends, and the fourth portion 224 of the second lead terminal 220 is located inward of the periphery thereof. However, it is not always necessary for the fourth portions 214 and 224 to remain when they are cut out from the lead frame 200. Alternatively, the fourth portions 214 and 224 can be bent backward. In this case, when cut out from the lead frame 200, although the fourth portions 214 and 224 protrude outwardly of the securing member 300, the fourth portions 214 and 224 are located inward of the periphery of the securing member 300 after they are bent backward. Instead of bending the fourth portions 214 and 224 backward, they can alternatively be bent frontward of the light emitting apparatus 100. In this case, they preferably do not overlie a window portion 302 of the light emitting apparatus 100.

The heat generated from the first light emitting element 110 is conducted to the third portion 213 of the first lead terminal 210, and is conducted to the second portion 212 of the same member. The conducted heat is mainly emitted from the second portion 212 to the outside. Similarly, the heat generated from the second light emitting element 120 is conducted to the third portion 223 of the second lead terminal 220, and is conducted to the second portion 222 of the same member. The conducted heat is mainly emitted from the second portion 222 to the outside. In addition, the heat generated from the third light emitting element 130 is conducted to the third portion 233 of the third lead terminal 230, and is conducted to the second portion 232 of the same member. The conducted heat is mainly emitted from the second portion 232 to the outside. Since the first lead terminal 210, the second lead terminal 220, and the third lead terminal 230 are divided, the heat generated from the respective light emitting elements 110, 120 and 130 is not directly conducted to the lead terminals adjacent to each other. Particularly, the heat generated from the first and second light emitting elements 110 and 120 is not directly conducted to the third light emitting element 130. Therefore, it is possible to prevent damage due to the heat from the light emitting element.

(Light Emitting Element)

A GaN group semiconductor, such as GaN, AlGaN, InGaN, and AlInGaN, that is formed as a light emitting layer on a substrate is employed as the first and second light emitting elements 110 and 120. A semiconductor, such as ZnS, ZnSe, SiC and GaP, GaAlAs, AlN and InN, and AlInGaP, that is formed as a light emitting layer is employed as the third light emitting element 130. Homo structure, hetero structure, or double-hetero structure with MIS junction, PIN junction or PN junction can be used as the structure of the semiconductor layer. The materials and the crystal mixture ratio of semiconductor can be variously selected to obtain wavelengths from the ultraviolet to infrared light. The light emitting layer can have a single quantum well structure or a multi-quantum-well structure with thin layer(s) for providing a quantum effect.

In the first and second light emitting elements 110 and 120 of gallium-nitride group compound semiconductor, a material, such as sapphire, spinel, SiC, Si, ZnO, and GaN single crystal, is employed as a substrate for the semiconductor. In order to manufacture a gallium nitride with good crystallinity in quantity, it is preferable to employ a sapphire substrate. Examples of the first and the second light emitting elements 110 and 120 of nitride group compound semiconductor are shown. A buffer layer, such as GaN and AlN, is formed on the sapphire substrate. A first contact layer of n- or p-type GaN, an active layer of thin InGaN layer for providing a quantum effect, a cladding layer of p- or n-type AlGaN, and a second contact layer of p- or n-type GaN are successively formed thereon. A gallium-nitride group compound semiconductor has n-type conductivity in the state where an impurity is not doped. In addition, in order to improve luminous efficiency, or to achieve other purpose, when a desired n-type gallium-nitride semiconductor is formed, it is preferable that Si, Ge, Se, Te, C, or the like, is doped, if necessary.

On the other hand, when a p-type gallium-nitride semiconductor is formed, Zn, Mg, Be, Ca, Sr, Ba, or the like, that are p-type dopants, are doped. Even if a gallium-nitride group compound semiconductor is doped with a p-type dopant, this can hardly provide p-type conductivity. Accordingly, after a p-type dopant is doped, it is necessary to anneal the semiconductor by heating with a furnace, low electron beam irradiation, plasma irradiation, and so on. After a semiconductor wafer formed as mentioned above is partially etched, positive and negative electrodes are formed thereon. Then, the semiconductor wafer is cut in a desired size, thus, the light emitting element can be formed.

In the case where a light emitting element that has a semiconductor of GaP or the like as a light emitting layer is used as the third light emitting element 130, not only a light emitting element having p-type and n-type layers that are laminated in the lower and upper surfaces, respectively, but also a light emitting element having p-type and n-type layers that are laminated in the upper and lower surfaces, respectively, can be used. In this case, as for an anode and a cathode, the third and sixth lead terminals 230 and 260 are reversed.

Not only one element each is used, but also two or more elements can be used, if necessary, for each of the first, second and third light emitting elements 110, 120 and 130 mentioned above. Depending on the combination, various color tones can be obtained, or the color mixture characteristics can be improved in white display. For example, two first light emitting elements 110 that can emit blue range light, one second light emitting element 120 that can emit green range light, and two third light emitting elements 130 that can emit red range light can be used. In addition, in order to use a light emitting apparatus as a light source for a full color scanner, it is preferable that the red, green, and blue range light-emission wavelengths fall within ranges of 610 nm to 700 nm, 495 nm to 565 nm, and 430 nm to 490 nm. In the case of white range color mixture light emission, in terms of complementary color relationship with light-emission wavelength from a later-described phosphor material, deterioration of a later-described transparent resin, and so on, the light emission peak wavelength of the first light emitting element is preferably not less than 400 nm and not more than 530 nm, more preferably not less than 420 nm and not more than 490 nm. In addition, in the case of combination with a transparent resin that is relatively less prone to deteriorate due to ultraviolet rays, a light emitting element with the main light-emission wavelength less than 400 nm in the ultraviolet range or a short wavelength range in visible light can also be used as the first light emitting element 110.

The light emitting element 10 with the size of 1 mm square can be mounted. Additionally, an element with the size of 600 µm square, 320 µm square or the like can be also used.

(Lead Frame and Lead Terminal)

The lead frame 200, and the first lead terminal 210 to the sixth lead terminal 260 can be composed of a high conductive material such as copper, iron, phosphor bronze, and copper alloy. In addition, in order to improve the reflectivity of the light from the first light emitting element 110 to the third light emitting element 130, metal plating, such as silver, aluminum, copper and gold plating, can be performed on the surface of the lead frame 200, and the first lead terminal 210 to the sixth lead terminal 260. Additionally, nickel, or the like, can be used as a primary layer for metal plating. Furthermore, in order to improve the reflectivity of the surfaces of the lead frame 200, and the first lead terminal 210 to the sixth lead terminal 260, it is preferable that they have smooth surfaces. Moreover, in order to improve heat dissipation characteristics of the first lead terminal 210 to the third lead terminal 230, the surfaces of the first lead terminal 210 to the third lead terminal 230 can be large. In this case, the temperature rises of the first light emitting element 110 to the third light emitting element 130 can be effectively suppressed. Accordingly, it is possible to provide relatively large amounts of currents to the first light emitting element 110 to the third light emitting element 130.

The first lead terminal 210 and the fourth lead terminal 240, the second lead terminal 220 and the fifth lead terminal 250, and the third lead terminal 230 and the sixth third lead terminal 260 are positive/negative pairs of electrodes.

The lead frame 200 is cut and serves as the first lead terminal 210 to the sixth lead terminal 260 after the securing member 300 secures them. It is preferable to cut the first portions 211, 221 and 231 of the first lead terminal 210 to the sixth lead terminal 260, and parts corresponding to them into the substantially same length. However, they may be cut into different lengths depending on respective different groups of the terminals. It is preferable that the first portions 211, 221 and 231, and parts corresponding to them of the first lead terminal 210 to the sixth lead terminal 260 have substantially the same width. However, they may have different widths depending on respective different groups of the terminals.

The second portion 212 in the first lead terminal 210 and the second portion 222 in the second lead terminal 222 have surface areas that are larger than the second portion 232 in the third lead electrode 230. The second portion 232 of the third lead terminal 230 has a surface area larger than parts corresponding to the second portions of the fourth lead terminal 240 to the sixth lead terminal 260. In addition, the second portion 212 in the first lead terminal 212 and the second portion 222 in the second lead terminal 222 can be used so as to have different surface areas depending on the amounts of heat generation of first and second light emitting elements 110 and 120.

(Securing Member)

The securing member 300 is not specifically limited as long as it can secure the first lead terminal 210 to the sixth lead terminal 260. For example, a resin member, such as BT resin, epoxy resin, silicone resin, denatured epoxy resin and denatured silicone resin, and a ceramic member can be employed.

In order to efficiently frontward radiate light emitted from the first light emitting element 110 to the third light emitting element 130, the securing member 300 is preferably white. However, the securing member 300 may be coated with a black film on the front surface in order to suppress reflection.

The securing member 300 secures the upper and lower parts of the third portion 213 of the first lead terminal 210, the third portion 223 of the second lead terminal 220 and the third portion 233 of the third lead terminal 230, and in some cases the side parts thereof, and thus firmly fastens the first lead terminal 210 to the third lead terminal 230. Accordingly, when the light emitting apparatus 100 is attached/detached to/from a power supply, the first lead terminal 210 to the sixth lead terminal 260 can be prevented from dropping off.

The securing member 300 has the cut-off portions 301 that are cut off at a prescribed depth. The cut-off portions 301 are located on the right and left side surfaces as viewed from the front side of the light emitting apparatus 100. A cut-off portion can be also located on the upper surface. In order to prevent the fourth portion 214 of the first lead terminal 210 that is cut out from the lead frame 200 from lying off the outermost periphery of the securing member 300, the cut-off portion 301 is located on the left side surface. The cut-off portion 301 for the fourth portion 224 of the second lead terminal 220 is located on the right side surface for a similar purpose.

The securing member 300 is provided with the prescribed window portion 302. The window portion 302 is formed in a recessed portion that has the bottom and side surfaces. The first lead terminal 210 to the sixth lead terminal 260 are located on the bottom surface of the recessed portion. The first light emitting element 110 to the third light emitting element 130 are located on the first lead terminal 210 to the third lead terminal 230. The shape of the window portion 302 as viewed from the front side is not specifically limited, and can be a substantially rectangular, substantially circular, substantially oval, and so on.

(Protective Element)

The first and second lead terminals 210 and 260, or the like, of this light emitting apparatus 100 can be provided with a protective element.

The protective element is an element accommodated in the window portion 302 of the securing member 300 together with semiconductor elements, such as the light emitting elements, and protects other semiconductor elements from damage due to overvoltage. The protective element can be an element having a semiconductor structure, or be also an element without a semiconductor structure.

A Zener diode that becomes in a conductive state when a specified voltage or more is applied, a capacitor that absorbs a pulse voltage, and so on, can be employed as a protective element that can be used in this embodiment.

The protective element that serves as a Zener diode has a p-type semiconductor region with a positive electrode, and an n-type semiconductor region with a negative electrode. The negative and positive electrodes of the protective element are connected to p-side and n-side electrodes of the light emitting element in reverse parallel relative to them. In the case where the protective element of a Zener diode, when the overvoltage is applied between positive and negative lead terminals, even if the voltage exceeds the Zener voltage of the Zener diode, the voltage between the positive and negative electrodes of the light emitting element is held at the Zener voltage. Accordingly, the voltage does not exceed this Zener voltage. As a result, application of overvoltage to the light emitting element can be prevented. Therefore, it is possible to protect the light emitting element from overvoltage, and to prevent damage to the element and the deterioration of performance.

A surface mount type chip component can be used as the protective element of a capacitor. The capacitor of this structure is provided with band-shaped electrodes on the both sides. The electrodes are connected to the positive and negative electrodes of the light emitting apparatus in parallel. In the case where an overvoltage is applied between the positive/negative pair of lead terminals, a charge current flows in the capacitor due to the overvoltage, and the terminal voltage of the capacitor immediately drops. Since the voltage applied to the light emitting apparatus does not rise, it is possible to protect the light emitting apparatus from the overvoltage. In addition, even if noise with a high frequency component is applied, the capacitor serves as a bypass capacitor, and thus can eliminate external noise.

(Method for Producing Light Emitting Apparatus)

Figure 6:
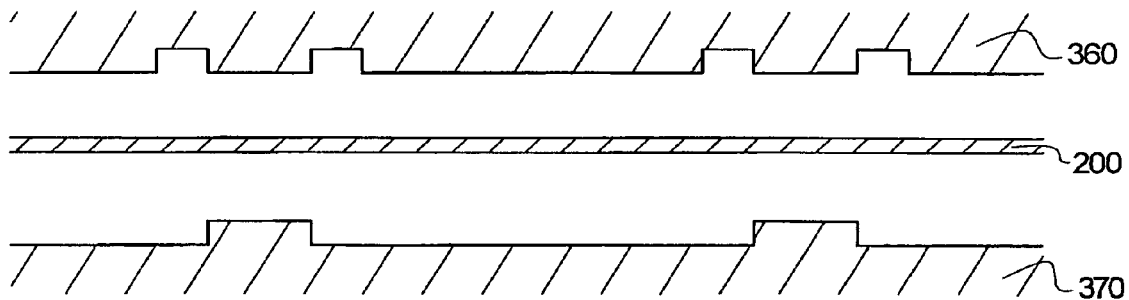
FIG. 6 is a schematic cross-sectional view showing manufacturing processes of the light emitting apparatus according to the first embodiment.
Figure 6:
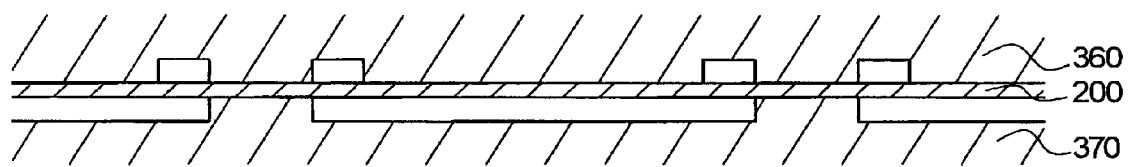
Figure 6:
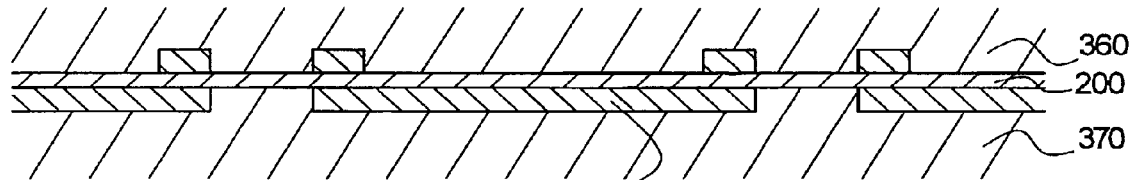
Figure 6:
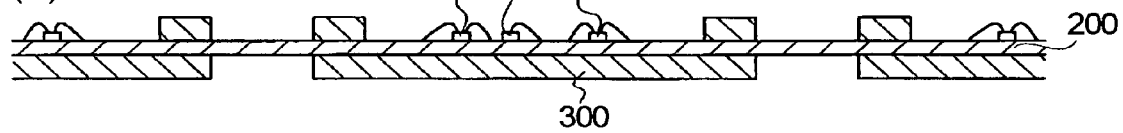
Figure 6:
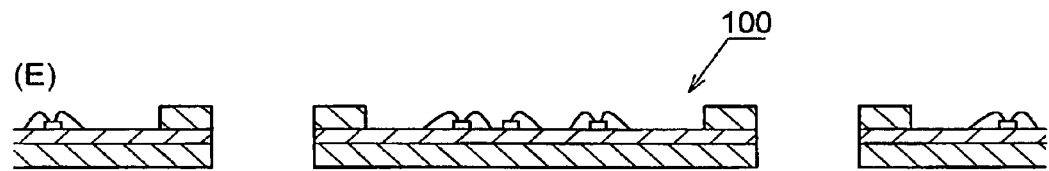

A manufacturing method of the light emitting apparatus 100 according to the first embodiment is schematically described. FIG. 5 is a schematic view showing the lead frame according to the first embodiment. FIG. 6 is a schematic cross-sectional view showing manufacturing processes of the light emitting apparatus according to the first embodiment.

The die cut lead frame 200 with a prescribed shape is sandwiched between upper and lower molds 360 and 370.

(2) The cavity that is encompassed by the upper and lower molds 360 and 370 is filled with a prescribed resin.

(Transfer Molding Method)

The upper and lower molds 360 and 370 are previously heated at a prescribed temperature by a heater. A resin tablet is provided in a part, so-called pot. The resin tablet is heated by a pre-heater to reduce the resin viscosity, and then casted into the mold. The resin is heated through the molds, thus, its viscosity decreases. A plunger is lowered, thus, the resin is injected into the mold. If parts corresponding to the fourth portion 214 of the first lead terminal 210 and the fourth portion 224 of the second lead terminal 220 are not connected to the lead frame 200, when the resin is injected, the first and second lead terminals 210 and 220 may wobble. The wobbling may require removing flash or may cause a defective product. For this reason, the parts corresponding to the fourth portions 214 and 224 are connected to the lead frame 200 to be able to suppress the wobbling of the first and second lead terminals 210 and 220, and so on.

(3) The resin is heated for curing.

The upper and lower molds 360 and 370 are further heated. The resin is held in the state it is filled therein for several minutes. The resin is cured by polymerization.

(4) After detachment of the upper and lower molds 360 and 370, the lead frame 200 is removed from the mold.

After removal of the lead frame 200 from the mold, an unnecessary resin part is eliminated. It is preferable to heat it at a high temperature for another several hours to complete the reaction.

(5) The first, second and third light emitting elements 110, 120 and 130 are mounted on prescribed positions in the lead frame 200.

The first light emitting element 110, or the like, is mounted by using a prescribed die-bonding resin.

(6) The respective electrodes of the light emitting elements and lead terminals are connected by the wires 350.

(7) The light emitting apparatus is cut out from the lead frame.

In this case, the fourth portions 214 and 224 of the first and second lead terminals 210 and 220 that are located in the cut-off portions 301 of the securing member 300 are cut so as not to lie off the outermost periphery of the securing member 300.

Thus, the light emitting apparatus 100 can be produced.

Second Embodiment

Figure 7:
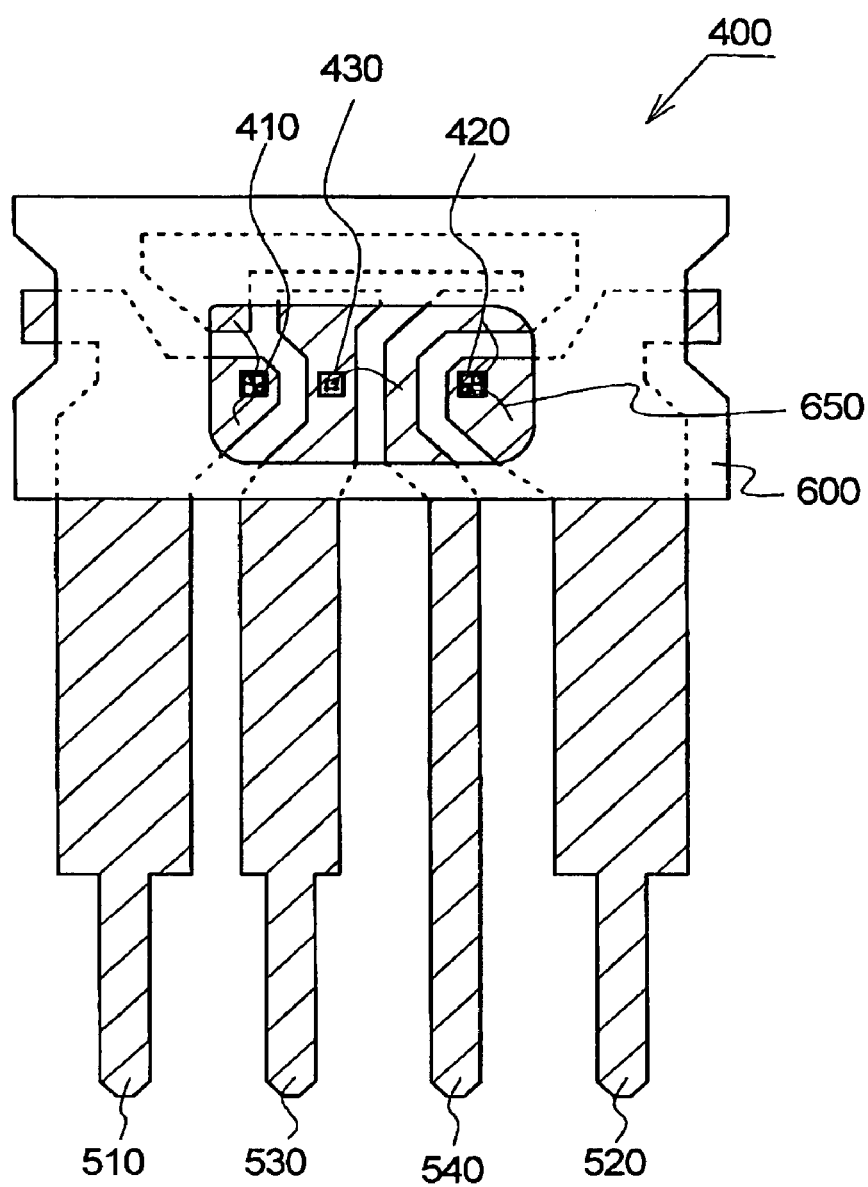
FIG. 7 is a schematic front view showing a light emitting apparatus according to a second embodiment.
Figure 8:
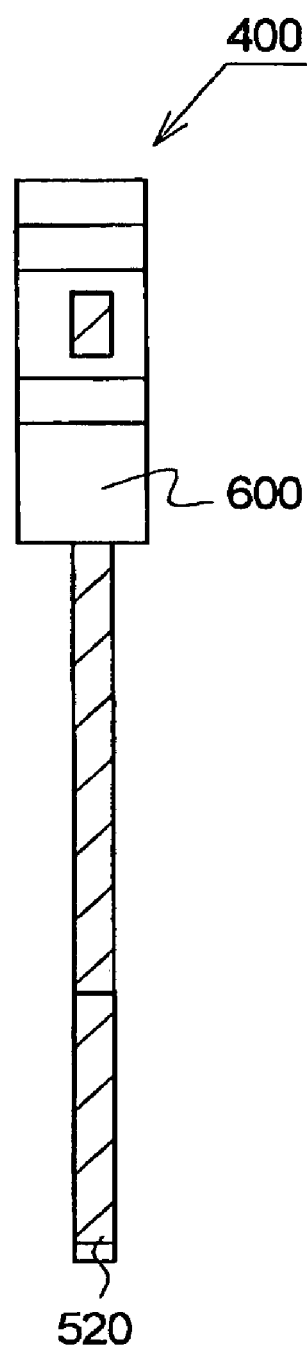
FIG. 8 is a schematic right side view showing the light emitting apparatus according to the second embodiment.

A light emitting apparatus according to a second embodiment is described with reference to the drawings. FIG. 7 is a schematic front view showing the light emitting apparatus according to the second embodiment. FIG. 8 is a schematic right side view showing the light emitting apparatus according to the second embodiment. The description of the substantially same structure as the light emitting apparatus according to first embodiment is omitted.

The light emitting apparatus 400 according to the second embodiment includes a first lead terminal 510, a second lead terminal 520, a third lead terminal 530, and a fourth lead terminal 540. The fourth lead terminal 540 serves as an integral lead terminal of the fourth lead terminal 210 to the sixth lead terminal 260 in the first embodiment. First, second and third light-emitting elements 410, 420 and 430 are mounted on the first, second and third lead terminals 510, 520 and 530, respectively. The first, second and third light-emitting elements 410, 420 and 430 are electrically connected to the fourth lead terminal 540 by wires 650. In order to prevent the first lead terminal 510 to the fourth lead terminal 540 from dropping off from the securing member 600, they have the variation of the lead terminal width, or bent parts. Thus, the lead terminals are formed so as to provide an anchor effect.

The leg parts of the first and second lead terminals 510 and 520 are the widest. In addition, the third lead terminal 530 and the fourth lead terminal 540 are thinner in this order. It is preferable that parts for connection to external terminals in the first lead terminal 510 to the fourth lead terminal 540 have the same shape, and are equally spaced away from each other.

Third Embodiment

Figure 9:
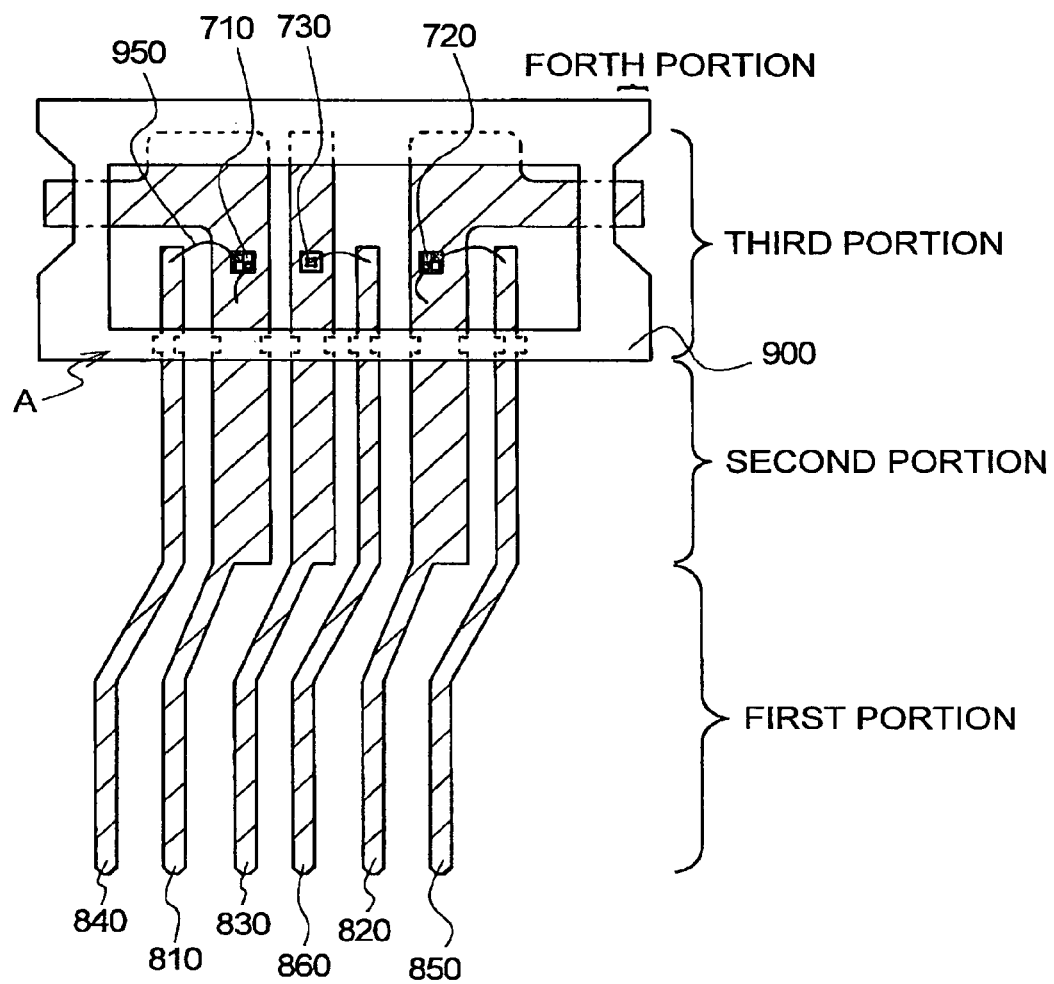
FIG. 9 is a schematic front view showing a light emitting apparatus according to a third embodiment.

A light emitting apparatus according to a third embodiment is described with reference to the drawings. FIG. 9 is a schematic front view showing the light emitting apparatus according to the third embodiment. The description of the substantially same structure as the light emitting apparatus according to first embodiment is omitted.

Third portions of first to sixth lead terminals 810 to 860 are formed so as to provide an anchor effect. The reason is to prevent the lead terminals from dropping off from a securing member 900. For example, the lead terminal can have the variation of the width, a bent shape, or asperities. In addition, first portions of the first to sixth lead terminals 810 to 860 are formed at a prescribed angle. Accordingly, it is possible to prevent the lead terminals from dropping off from the securing member 900.

The light emitting apparatus 700, and so on, can further include one or more lead terminals, and a light emitting element can be mounted to any one of the one or more lead terminals. For example, a GaN group light emitting element that emits blue light, a GaN group light emitting element that emits bluish green light, a GaN group light emitting element that emits green light, and a light emitting element that emits red light can be used.

Fourth Embodiment

Figure 10:
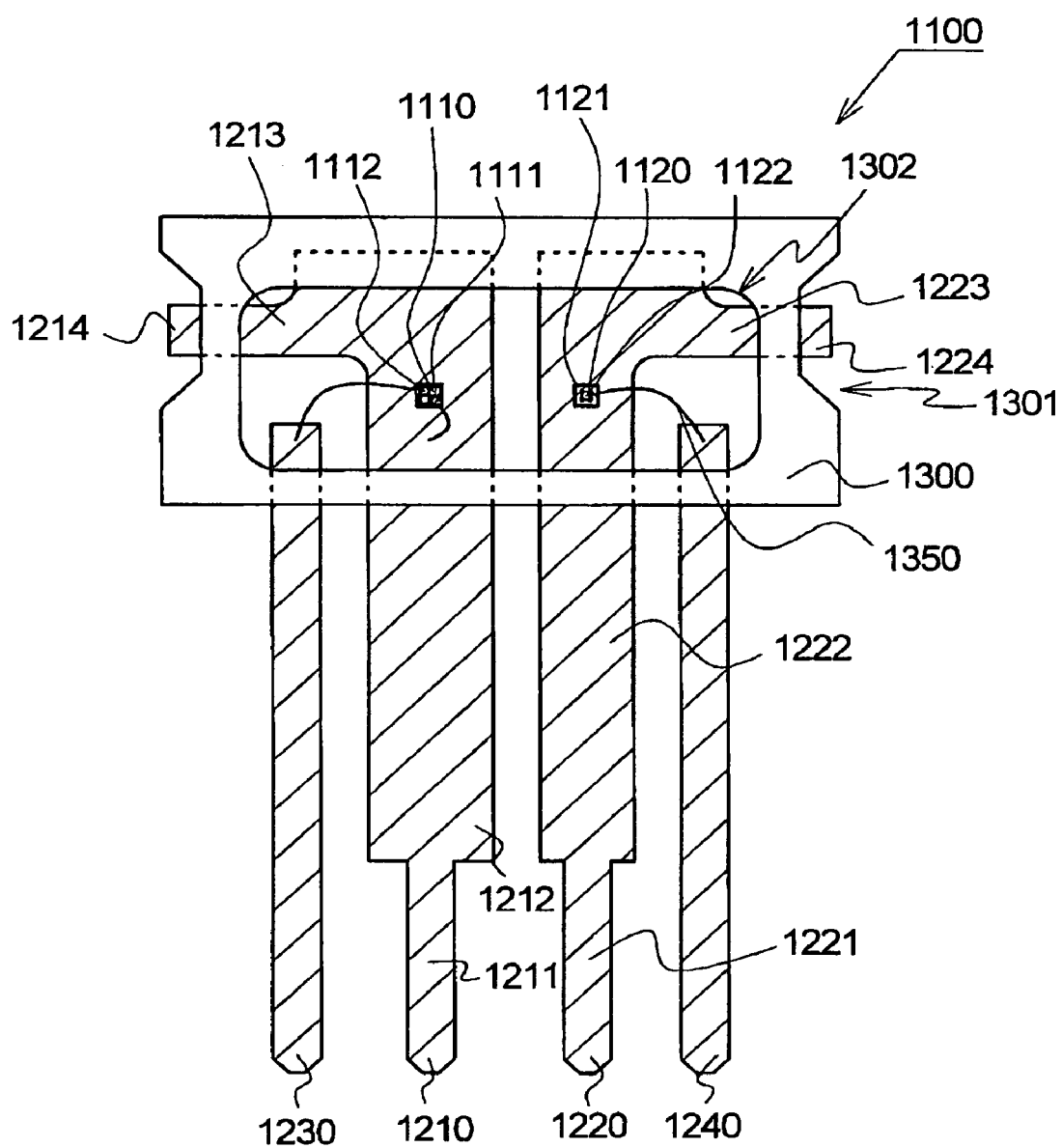
FIG. 10 is a schematic front view showing a light emitting apparatus according to a fourth embodiment.
Figure 11:
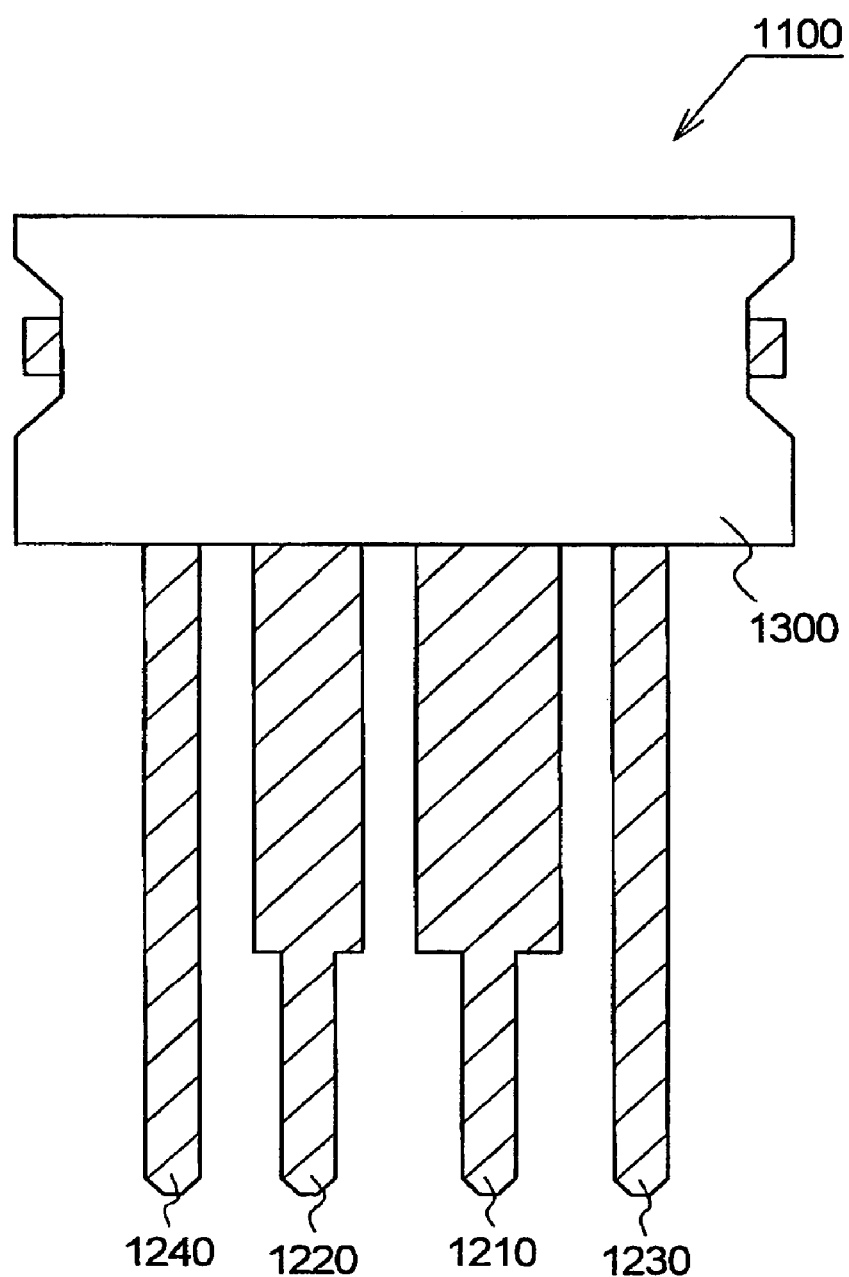
FIG. 11 is a schematic back view showing the light emitting apparatus according to the fourth embodiment.
Figure 12:
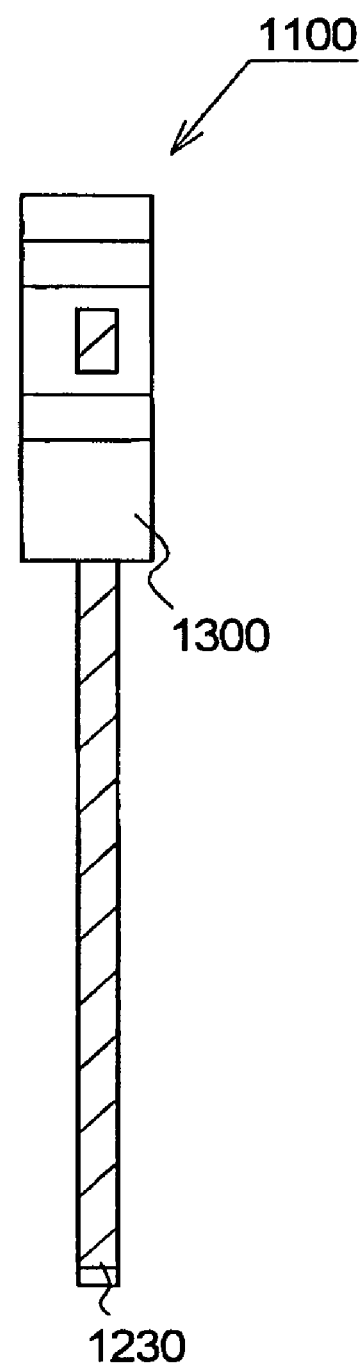
FIG. 12 is a schematic left side view showing the light emitting apparatus according to the fourth embodiment.

A light emitting apparatus according to a fourth embodiment is described with reference to the drawings. FIG. 10 is a schematic front view showing the light emitting apparatus according to the fourth embodiment. FIG. 11 is a schematic back view showing the light emitting apparatus according to the fourth embodiment. FIG. 12 is a schematic left side view showing the light emitting apparatus according to the fourth embodiment. The description of the substantially same structure as the light emitting apparatus according to first embodiment is omitted.

A light emitting apparatus 1100 comprises a first GaN group light emitting element 1110 having a first light emission peak wavelength; a second light emitting element 1120 having a second light emission peak wavelength longer than the first light emission peak wavelength; a first lead terminal 1210 that is provided with the first light emitting element 1110 mounted thereon; a second lead terminal 1220 that is provided with the second light emitting element 1120 mounted thereon; a third lead terminal 1230 that is electrically connected to the first light emitting element 1110; a fourth lead terminal 1240 that is electrically connected to the second light emitting element 1120; a securing member 1300 that secures the first lead terminal 1210 to the fourth lead terminal 1240. A light emitting element that emits blue light is used as the first light emitting element 1110. A light emitting element that emits red light is used as the second light emitting element 1120. Alternatively, a light emitting element that emits green light can be used as the first light emitting element 1110, and a light emitting element that emits red light can be used as the second light emitting element 1120.

The first lead terminal 1210 is composed integrally of a first portion 1211 that is electrically connected to an external terminal, a second portion 1212 that is exposed from the securing member 1300 and a third portion 1213 that is provided with the first light emitting element 1110 mounted thereon. Similarly, the second lead terminal 1220 is composed integrally of a first portion 1221 that is electrically connected to an external terminal, a second portion 1222 that is exposed from the securing member 1300 and a third portion 1223 that is provided with the second light emitting element 1120 mounted thereon. The surface area of the second portion 1212 in the first lead terminal 1210 is larger than the surface area of the second portion 1222 in the second lead terminal 1220. The first portion 1211 of the first lead terminal 1210 and the first portion 1221 of the second lead terminal 1220 have substantially the same width. In addition, the second portion 1212 of the first lead terminal 1210 has a surface area larger than parts corresponding to second portions of the third lead terminal 1230 and the fourth lead terminal 1240. The second portion 1222 of the second lead terminal 1220 has a surface area that is larger than the parts corresponding to the second portions of the third lead terminal 1230 and the fourth lead terminal 1240. Although the third and fourth lead terminals 1230 and 1240 are separately provided, they can be integrally formed.

The second and first portions 1212 and 1211 of the first lead terminal 1210 extend from the lower surface of the securing member 1300, and the fourth portion 1214 of the first lead terminal 1210 extends from the left side surface of the securing member 1300. Similarly, the second and first portions 1222 and 1221 of the second lead terminal 1220 extend from the lower surface of the securing member 1300, and the fourth portion 1224 of the second lead terminal 1220 extends from the right side surface of the securing member 1300.

A cut-off portion 1301 is formed in a part of the securing member 1300 where the fourth portion 1214 of the first lead terminal 1210 extends, and the fourth portion 1214 of the first lead terminal 1210 is located inward of the periphery thereof. Another cut-off portion 1301 is formed in a part of the securing member 1300 where the fourth portion 1224 of the second lead terminal 1220 extends, and the fourth portion 1224 of the second lead terminal 1220 is located inward of the periphery thereof.

The third portions 1213 and 1223 of the first and second lead terminals 1210 and 1220 can be formed so as to provide an anchor effect.

The securing portion 1300 includes a window portion 1302 that has the bottom and side surfaces and formed therein. The third portion 1213 of the first lead terminal 1210 that is provided with the first light emitting element 1110, and the third portion 1223 of the second lead terminal 1220 that is provided with the second light emitting element 1120 are located on the bottom surface. A transparent resin can be provided in the window portion 1302 encompassed by the bottom and side surfaces. The transparent resin can include a phosphor material. For example, the light emitting apparatus 1100 having the first light emitting element 1110 for emitting blue light, the second light emitting element 1120 for emitting red light 1120, and a phosphor material for emitting yellow luminescent radiation can be provided.

Fifth Embodiment

Figure 13:
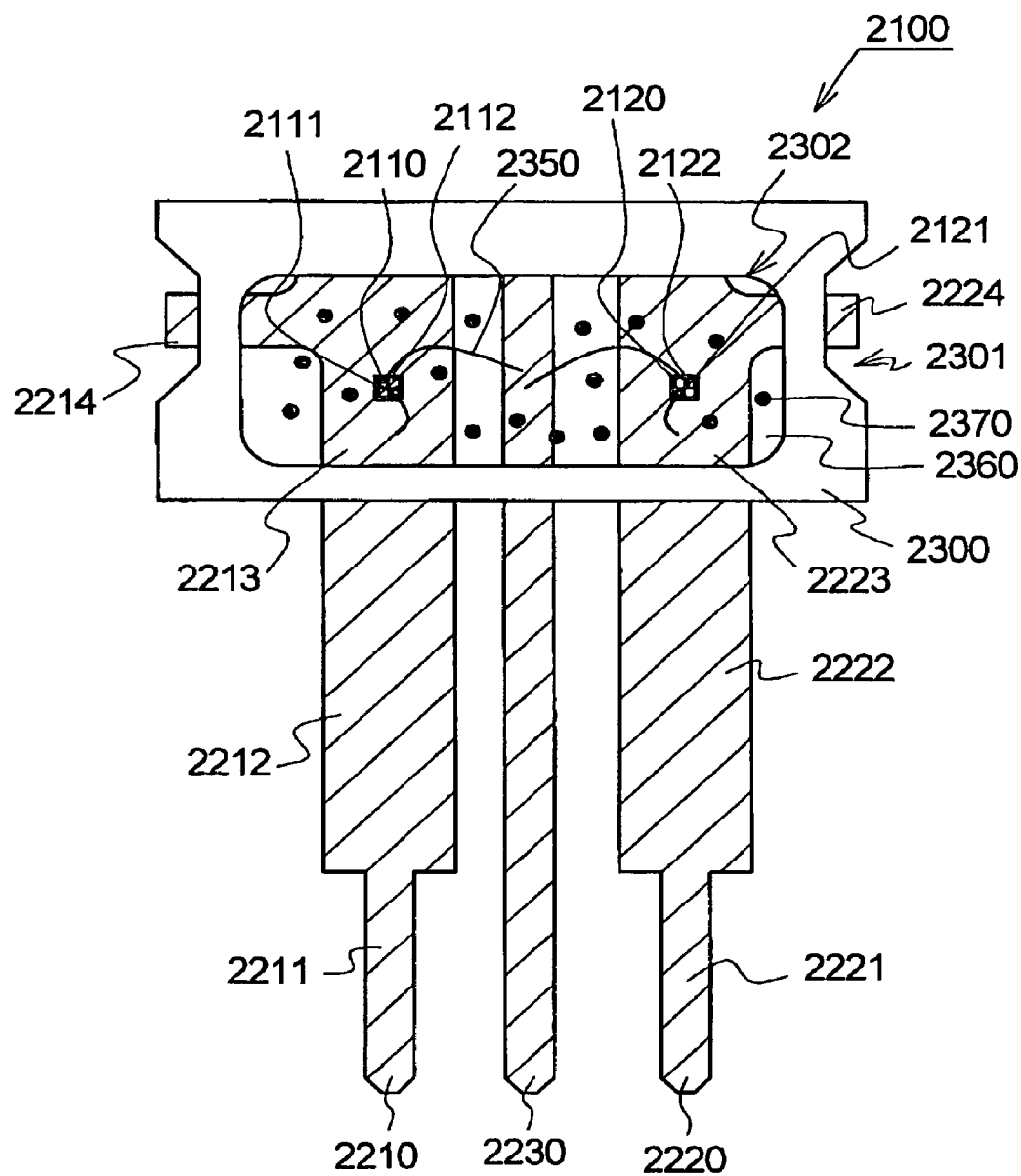
FIG. 13 is a schematic front view showing a light emitting apparatus according to a fifth embodiment.
Figure 14:
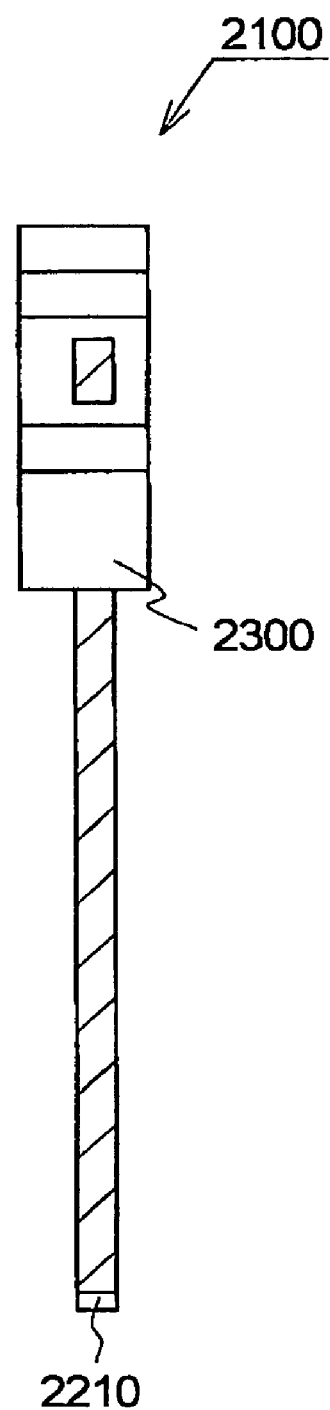
FIG. 14 is a schematic left side view showing the light emitting apparatus according to the fifth embodiment.
Figure 15:
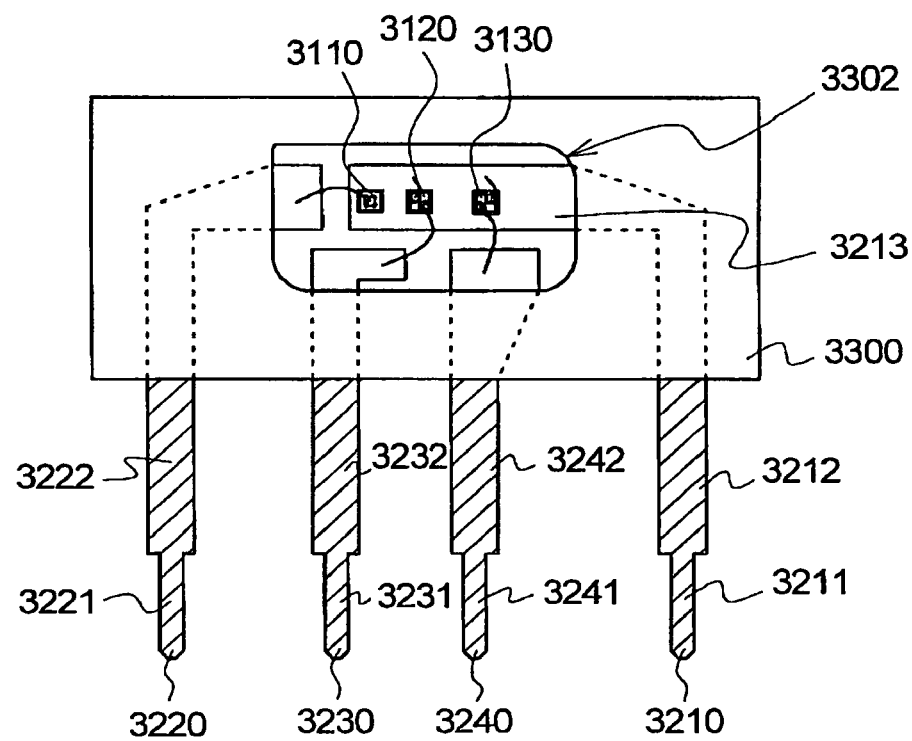
FIG. 15 is a schematic front view showing a conventional light emitting apparatus.

A light emitting apparatus according to a fifth embodiment is described with reference to the drawings. FIG. 13 is a schematic front view showing the light emitting apparatus according to the fifth embodiment. FIG. 14 is a schematic left side view showing the light emitting apparatus according to the fifth embodiment. The description of the substantially same structure as the light emitting apparatus according to first embodiment is omitted.

A light emitting apparatus 2100 comprises a first GaN group light emitting element 2110; a second GaN group light emitting element 2120; a first lead terminal 2210 that is provided with the first light emitting element 2110 mounted thereon; a second lead terminal 2220 that is provided with the second light emitting element 2120 mounted thereon; a third lead terminal 2230 that is electrically connected to the first light emitting element 2110; a securing member 2300 that secures the first lead terminal 2210 to the third lead terminal 2230.

The first lead terminal 2210 is composed integrally of a first portion 2211 that is electrically connected to an external terminal, a second portion 2212 that is exposed from the securing member 2300 and a third portion 2213 that is provided with the first light emitting element 2110 mounted thereon. Similarly, the second lead terminal 2220 is composed integrally of a first portion 2221 that is electrically connected to an external terminal, a second portion 2222 that is exposed from the securing member 2300 and a third portion 2223 that is provided with the second light emitting element 2120 mounted thereon.

The securing portion 2300 forms a window portion 2302 having the bottom and side surfaces. The third portion 2213 of the first lead terminal 2210 that is provided with the first light emitting element 2110, and the third portion 2223 of the second lead terminal 2220 that is provided with the second light emitting element 2220 are located on the bottom surface. The lead terminals are exposed therein. A transparent resin 2360 is provided in the window portion 2302 encompassed by the bottom and side surfaces. The transparent resin 2360 contains a phosphor material 2370. The transparent resin 2360 can be formed so as to be coplanar with the front surface of the securing member 2300 or to be recessed inside the window portion 2302. The second portions 2212 and 2222 of the first and second lead terminals 2210 and 2220 have a surface area larger than the parts corresponding to a second portion of the third lead terminal 2230.

Although one third lead terminal 2230 is formed, it can be provided one each for the first and second lead terminals 2210 and 2220.

The third portions 2213 and 2223 of the first and second lead terminals 2210 and 2220 can be formed so as to be substantially the same symmetrical shape, however, they can have different shapes.

Additional lead terminals and light emitting elements can be provided, thus, three or more light emitting elements can be provided.

For example, the first and second light emitting elements 2120 and 1120 that are the same light emitting elements for emitting blue light, and the phosphor material 2270 for emitting yellow luminescent radiation are used. In this case, the high luminescent white light emitting apparatus 2110 can be provided.

(Transparent Resin)

The transparent resin 2360 is provided in the window portion 2302 of a recessed shape with the bottom and side surface of the securing member 2300. This can protect the light emitting elements from external force of the environmental influence, moisture, and so on, and, in the case where the phosphor material 2370 is mixed, can change the color tone. In addition, the transparent resin is used to efficiently radiate light from the light emitting elements outward by using the refractive index difference. As a specific material composing the transparent resin 2360, a transparent resin with excellent weather resistance, such as silicone resin, epoxy resin, urea resin, denatured epoxy resin, denatured silicone resin, and polyamide, is preferably used. Particularly, a silicone resin with excellent heat resistance is more preferably used. Additionally, in order to further increase the viewing angle or to uniformly radiate light, the transparent resin 2360 may contain a diffusion member. Specifically, barium titanate, titanium oxide, aluminum oxide, silicon oxide, and so on, can be preferably used as the diffusion member. Moreover, in order to cut the wavelength out of a desired range, organic or inorganic color dye, or color pigment can be contained.

(Phosphor Material)

A material can be used as the phosphor material 2370 as long as it absorbs light from the light emitting element and emits luminescent radiation with different wavelength. For example, it is preferable to employ at least one material selected from the group consisting of a nitride group phosphor and a nitride oxide group phosphor that are mainly activated by a lanthanoid element, such as Eu and Ce; an alkaline-earth halogen apatite phosphor, an alkaline-earth-metal boric-acid halogen phosphor, an alkaline-earth-metal aluminate phosphor, alkaline-earth silicate, alkaline-earth sulfide, alkaline-earth thiogallate, alkaline-earth silicon nitride and germanate that are mainly activated with the element of transition-metal groups, such as a lanthanoid group, such as Eu, and Mn; rare earth aluminate and rare earth silicate that are mainly activated by a lanthanoid element, such as Ce; and an organic material and organic complex that are mainly activated by a lanthanoid element, such as Eu. As specific examples, the following phosphors can be used; however, the present invention is not limited to these phosphors.

As for a nitride group phosphor that is mainly activated by a lanthanoid element, such as Eu and Ce, $M_2Si_5N_8$:Eu (where M is at least one element selected from the group consisting of Sr, Ca, Ba, Mg and Zn) can be given as an example. In addition to $M_2Si_5N_8$:Eu, $MSi_7N_{10}$:Eu, $M_{1.8}Si_5O_{0.2}N_8$:Eu, and $M_{0.9}Si_7O_{0.1}N_{10}$:Eu (where M is at least one element selected from the group consisting of Sr, Ca, Ba, Mg and Zn) can be given as examples.

As for a nitride oxide group phosphor that is mainly activated by a lanthanoid element, such as Eu and Ce, $MSi_2O_2N_2$:Eu (where M is at least one element selected from the group consisting of Sr, Ca, Ba, Mg and Zn) can be given as an example.

As for an alkaline-earth halogen apatite phosphor that is mainly activated by a lanthanoid element, such as Eu, $M_5(PO_4)_3X$:R (where M is at least one element selected from the group consisting of Sr, Ca, Ba, Mg and Zn, X is at least one element selected from the group consisting of F, Cl, Br and I, and R is at least one element selected from the group consisting of Eu, Mn, Eu and Mn) can be given as an example.

As for an alkaline-earth-metal boric-acid halogen phosphor, $M_2B_5O_9X$:R (where M is at least one element selected from the group consisting of Sr, Ca, Ba, Mg and Zn, X is at least one element selected from the group consisting of F, Cl, Br and I, and R is at least one element selected from the group consisting of Eu, Mn, Eu and Mn) can be given as an example.

As for an alkaline-earth-metal aluminate phosphor, $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (where R is at least one element selected from the group consisting of Eu, Mn, Eu and Mn) can be given as examples.

As for an alkaline-earth sulfide phosphor, $La_2O_2S$:Eu, $Y_2O_2S$:Eu, $Gd_2O_2S$:Eu can be given as examples.

As for a rare earth aluminate phosphor that is mainly activated by a lanthanoid element, such as Ce, a YAG group phosphor represented by the composition formulas $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, $(Y,Gd)_3(Al,Ga)_5O_{12}$ can be given as an example. In addition, $Tb_3Al_5O_{12}$:Ce, $Lu_3Al_5O_{12}$:Ce obtained by substituting Tb, Lu, or the like, for a part of or the whole of Y can be given as examples.

As for the other phosphors, ZnS:Eu, $Zn_2GeO_4$:Mn, and $MGa_2S_4$:Eu (where M is at least one element selected from the group consisting of Sr, Ca, Ba, Mg and Zn, and X is at least one element selected from the group consisting of F, Cl, Br and I) can be given as examples.

As for the aforementioned phosphors, at least one element selected the group consisting of Tb, Cu, Ag, Au, Cr, Nd, Dy, Co, Ni and Ti can be contained instead of Eu, or in addition to Eu, if desired.

Additionally, a phosphor other than the aforementioned phosphor with similar performance and effect can be used.

A phosphor that has the light emission spectrum in a yellow, red, green, or blue region due to excitation of light from the light emitting element can be used. In addition, a phosphor that has the light emission spectrum in the intermediate color region of them, such as yellow, bluish green and orange, can be also used. Various combinations of these phosphors can provide light emitting apparatuses with various light emission colors.

For example, a GaN group compound semiconductor light emitting element that emits blue light is used, and radiates a YAG group phosphor $Y_3Al_5O_{12}$:Ce or $(Y_{0.8}Gd_{0.2})_3Al_5O_{12}$:Ce to converts the wavelength. It is possible to provide a light emitting apparatus that emits white light obtained by mixture light between light from the light emitting element and light from the YAG group phosphor.

For example, a GaN group compound semiconductor light emitting element having a light emission peak wavelength in the ultraviolet range is used, and radiates a phosphor consisting of $CaSi_2O_2N_2$:Eu or $SrSi_2O_2N_2$:Eu that emits green to yellow luminescent radiation, $(Sr, Ca)_5(PO_4)_3Cl$:Eu that emits blue luminescent radiation, and $(Ca,Sr)_2Si_5N_8$:Eu that emits red luminescent radiation with light in the ultraviolet range such that the phosphor absorbs the light. In this case, it is possible to provide a light emitting apparatus with excellent color rendering that emits white light. The reason is that, since red, blue and green of the primary colors are used, variation of the composition ratio of the phosphor can provide a desired white light.

Sixth Embodiment

A light source according to a sixth embodiment is described.

The light source according to the sixth embodiment comprises a light guiding member, and the light emitting apparatus according to the first embodiment attached therein. This light source can be used in the state where it is plugged in a power supply.

The light guiding member guides light emitted from the light emitting apparatus, and radiates the light in a prescribed direction. The light repeatedly travels and is reflected inside the light guiding member, thus, the light guiding member uniformly radiates the light from one end to the other end. A transparent resin, such as acrylic resin, polyamide resin, polymethyl methacrylate and polycarbonate, can be used as a material of the light guiding member. Additionally, glass can be also used. A fit portion that attaches the light emitting element can be provided on one end.

EXAMPLE

Example 1

A light emitting apparatus according to an example 1 is described with reference to FIGS. 1 to 4. Its description is partially omitted by the use of the description of the light emitting apparatus according to the first embodiment.

The first light emitting element 110 to the third light emitting element 130, the first lead terminal 210 to the sixth lead terminal 260, and the securing member 300 are used. The first light emitting element 110 to the third light emitting element 130 are mounted on the first lead terminal 210 to the third lead terminal 230, respectively. The first light emitting element 110 having a light emission peak wavelength in the proximity of the range between 440 nm and 480 nm, the second light emitting element 120 having a light emission peak wavelength in the proximity of the range between 500 nm and 540 nm, and the third light emitting element 130 having a light emission peak wavelength in the proximity of the range between 610 nm and 700 nm are used. Copper is employed as a base material of the lead terminal. Nickel is employed as a primary layer in a part exposed from the securing member 300, and silver plating is performed. The light emitting elements are connected to the lead terminals by the gold wires 350. The light emitting elements are mounted by die-bonding with an epoxy resin containing an Ag filler mixed therein. Mixture of Ag filler provides an electrical connection between the back surface of the third light emitting element 130 and the six lead terminals.

The light emitting apparatus according to the present invention can be used as a light emitting apparatus used in an image reader, backlight for liquid crystal, and so on, more specifically in a facsimile, a copier, a scanner, and so on.

As this invention may be embodied in several forms without departing from the spirit or essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims. This application is based on Application No. 2004-363808 filed in Japan on Dec. 16, 2004, the content of which is incorporated hereinto by reference.

What is claimed is:

1. A light emitting apparatus comprising;
a first GaN group light emitting element having a first light emission peak wavelength;
a second GaN group light emitting element having a second light emission peak wavelength longer than the first light emission peak wavelength;
a third light emitting element having a third light emission peak wavelength longer than the second light emission peak wavelength;
a first lead terminal with the first light emitting element mounted thereon;
a second lead terminal with the second light emitting element mounted thereon;
a third lead terminal with the third light emitting element mounted thereon;
a fourth lead terminal electrically connected to the first light emitting element;
a fifth lead terminal electrically connected to the second light emitting element;
a sixth lead terminal electrically connected to the third light emitting element; and
a securing member that secures the first to sixth lead terminals, wherein:
the first lead terminal is composed integrally of a first portion that is electrically connectable to an external terminal, a second portion that is exposed from the securing member, a third portion that is provided with the first light emitting element mounted thereon, and a fourth portion that is exposed from the securing member;
the second lead terminal is composed integrally of a first portion that is electrically connectable to an external terminal, a second portion that is exposed from the securing member, a third portion that is provided with the second light emitting element mounted thereon, and a fourth portion that is exposed from the securing member;
the third lead terminal is composed integrally of a first portion that is electrically connectable to an external terminal and is exposed from the securing member, a second portion that is exposed from the securing member and a third portion that is provided with the third light emitting element mounted thereon; and
the surface area of the first and second portions of any of the first and second lead terminals is larger than the surface area of the first and second portions of the third lead terminal,
the second and first portions of the first lead terminal extend so as to be externally exposed from a first surface of the securing member, and the fourth portion of the first lead terminal extends to the outside of the securing member so as to be externally exposed from a second surface of the securing member, the second surface being perpendicular to the first surface of the securing member, and the second and first portions of the second lead terminal extend so as to be externally exposed from the first surface of the securing member, and the fourth portion of the second lead terminal extends to the outside of the securing member so as to be externally exposed from a third surface of the securing member, the third surface being perpendicular to the first surface of the securing member.

2. The light emitting apparatus according to claim 1, wherein the first portions of the first, second and third lead terminals have substantially the same width, and the surface areas of the second portions of the first and second lead terminals are larger than the second portion of the third lead terminal.

3. The light emitting apparatus according to claim 1, wherein the surface area of an exposed part of the third lead terminal is larger than an exposed part of the sixth lead terminal.

4. The light emitting apparatus according to claim 1, wherein at least any two of the fourth to sixth lead terminals are integrally formed.

5. The light emitting apparatus according to claim 1, wherein any of the third portions of the first, second and third lead terminals is formed so as to provide an anchor effect.

6. The light emitting apparatus according to claim 1, wherein the light emitting apparatus further comprises one or more lead terminals, wherein a light emitting element is mounted to any one of the one or more lead terminals.

7. A light source comprising the light emitting apparatus according to claim 1 and a light guiding member that guides light emitted from the light emitting apparatus.

8. A light emitting apparatus according to claim 1, wherein the first lead terminal, the second lead terminal and the third lead terminal are aligned substantially in parallel and extend in the same direction.

9. The light emitting apparatus according to claim 1, wherein the second and first portions of the first lead terminal extend from one surface of the securing member, and the fourth portion of the first lead terminal extends from other surface of the securing member, wherein a cut-off is formed in a part of the securing member where the fourth portion of the first lead terminal extends, and the fourth portion of the first lead terminal is located inward of the periphery thereof, wherein the second and first portions of the second lead terminal extend from one surface of the securing member, and the fourth portion of the second lead terminal extends from other surface of the securing member, wherein a cut-off is formed in a part of the securing member where the fourth portion of the second lead terminal extends, and the fourth portion of the second lead terminal is located inward of the periphery thereof.

10. A light emitting apparatus comprising:
a first GaN group light emitting element having a first light emission peak wavelength;
a second GaN group light emitting element having a second light emission peak wavelength longer than the first light emission peak wavelength;
a third light emitting element having a third light emission peak wavelength longer than the second light emission peak wavelength;

a first lead terminal with the first light emitting element mounted thereon;
a second lead terminal with the second light emitting element mounted thereon;
a third lead terminal with the third light emitting element mounted thereon;
a fourth lead terminal electrically connected to the first light emitting element;
a fifth lead terminal electrically connected to the second light emitting element;
a sixth lead terminal electrically connected to the third light emitting element; and
a securing member that secures the first to sixth lead terminals, wherein:
the first lead terminal is composed integrally of a first portion that is electrically connectable to an external terminal, a second portion that is exposed from the securing member, a third portion that is provided with the first light emitting element mounted thereon, and a fourth portion that is exposed from the securing member;
the second lead terminal is composed integrally of a first portion that is electrically connectable to an external terminal, a second portion that is exposed from the securing member, a third portion that is provided with the second light emitting element mounted thereon, and a fourth portion that is exposed from the securing member;
the third lead terminal is composed integrally of a first portion that is electrically connectable to an external terminal and is exposed from the securing member, a second portion that is exposed from the securing member and a third portion that is provided with the third light emitting element mounted thereon; and
the surface area of the first and second portions of any of the first and second lead terminals is larger than the surface area of the first and second portions of the third lead terminal,
the second and first portions of the first lead terminal extend so as to be externally exposed from one surface of the securing member, and the fourth portion of the first lead terminal extends to the outside of the securing member so as to be externally exposed from another surface of the securing member, wherein a first cut-out is formed in a peripheral portion of the securing member where the fourth portion of the first lead terminal extends, and
the second and first portions of the second lead terminal extend so as to be externally exposed from one surface of the securing member, and the fourth portion of the second lead terminal extends to the outside the securing member so as to be externally exposed from another surface of the securing member, wherein a second cut-out is formed in a peripheral portion of the securing member where the fourth portion of the second lead terminal extends.

11. The light emitting apparatus according to claim 10, wherein the first cut-out is formed to have a prescribed depth so that the fourth portion of the first lead terminal is located at a bottom of the first cut-out, and
wherein the second cut-out is formed to have a prescribed depth so that the fourth portion of the second lead terminal is located at a bottom of the second cut-out.

* * * * *